US012615895B2

(12) United States Patent
Hwang et al.

(10) Patent No.: US 12,615,895 B2
(45) Date of Patent: Apr. 28, 2026

(54) COLOR CONVERSION STRUCTURE, DISPLAY APPARATUS, AND METHOD OF MANUFACTURING COLOR CONVERSION STRUCTURE

(71) Applicant: SAMSUNG ELECTRONICS CO., LTD., Suwon-si (KR)

(72) Inventors: Kyungwook Hwang, Seoul (KR); Hyunjoon Kim, Seoul (KR); Joonyong Park, Suwon-si (KR); Seogwoo Hong, Yongin-si (KR); Junsik Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 706 days.

(21) Appl. No.: 17/991,411

(22) Filed: Nov. 21, 2022

(65) Prior Publication Data

US 2023/0197912 A1     Jun. 22, 2023

(30) Foreign Application Priority Data

Dec. 17, 2021     (KR) ........................ 10-2021-0181734

(51) Int. Cl.
H10H 20/851     (2025.01)
G02B 5/08     (2006.01)
(Continued)

(52) U.S. Cl.
CPC ........... H10H 20/8514 (2025.01); G02B 5/08 (2013.01); H10H 20/8512 (2025.01);
(Continued)

(58) Field of Classification Search
CPC ........... H10H 20/8514; H10H 20/8512; H10H 20/856; H10H 20/0361; H10H 20/034; H10H 20/841; H10H 20/01; H10H 20/8513; H10H 20/85; H10H 20/036; H10H 20/0363; H10H 20/84; H10H 20/8511;
(Continued)

(56) References Cited

U.S. PATENT DOCUMENTS 9,240,145 B2     1/2016  Ichioka et al.
9,753,214 B2     9/2017  Shin et al.
(Continued)

FOREIGN PATENT DOCUMENTS

JP     2004-281086 A     10/2004
JP     4771837 B2     9/2011
(Continued)

OTHER PUBLICATIONS

Communication issued Jun. 5, 2025 by the Korean Intellectual Property Office in Korean Patent Application No. 10-2021-0181734.
(Continued)

*Primary Examiner* — Jonathan Han
(74) *Attorney, Agent, or Firm* — Sughrue Mion, PLLC

(57) ABSTRACT

Provided are a color conversion structure, a display apparatus, and a method of manufacturing a color conversion structure. The color conversion structure includes a bank structure including a groove, a color conversion layer accommodated in the groove, and a cover layer provided on the color conversion layer.

32 Claims, 46 Drawing Sheets

(51) Int. Cl.

| | |
|---|---|
| *H01L 25/075* | (2006.01) |
| *H10H 20/01* | (2025.01) |
| *H10H 20/856* | (2025.01) |
| *H10W 90/00* | (2026.01) |

(52) U.S. Cl.
CPC .......... *H10H 20/856* (2025.01); *H10W 90/00* (2026.01); *H10H 20/0361* (2025.01)

(58) Field of Classification Search
CPC ..... G02B 5/08; H01L 25/0753; H01L 25/167; H01L 2224/95101
See application file for complete search history.

(56) References Cited

U.S. PATENT DOCUMENTS

| | | | |
|---|---|---|---|
| 10,115,862 | B2 | 10/2018 | Zhan et al. |
| 10,151,867 | B2 * | 12/2018 | Shin .................. H10H 20/8514 |
| 10,211,364 | B2 | 2/2019 | Schuele et al. |
| 10,243,097 | B2 | 3/2019 | Yuen |
| 10,418,527 | B2 | 9/2019 | Sasaki et al. |
| 10,680,144 | B2 | 6/2020 | Yoo et al. |
| 10,930,819 | B2 | 2/2021 | Sasaki et al. |
| 2011/0273079 | A1 | 11/2011 | Pickard et al. |
| 2017/0345977 | A1 | 11/2017 | Goeoetz et al. |
| 2019/0123033 | A1 * | 4/2019 | Martin ................. H10H 20/819 |
| 2019/0137815 | A1 * | 5/2019 | Kim .................... H10K 50/171 |
| 2020/0152826 | A1 | 5/2020 | Lee et al. |
| 2020/0152841 | A1 * | 5/2020 | Han .................... H01L 25/0753 |
| 2021/0091257 | A1 | 3/2021 | Hwang et al. |
| 2021/0119079 | A1 | 4/2021 | Hwang et al. |
| 2021/0183301 | A1 * | 6/2021 | Choi ................... H10H 29/142 |
| 2021/0397045 | A1 | 12/2021 | Hwang et al. |
| 2022/0013400 | A1 | 1/2022 | Hwang et al. |
| 2022/0029046 | A1 | 1/2022 | Hong et al. |
| 2022/0037415 | A1 * | 2/2022 | Lin ..................... H10K 59/126 |
| 2022/0102602 | A1 | 3/2022 | Hwang et al. |
| 2022/0189810 | A1 | 6/2022 | Hwang et al. |
| 2022/0328733 | A1 | 10/2022 | Hwang et al. |
| 2022/0328737 | A1 | 10/2022 | An et al. |

FOREIGN PATENT DOCUMENTS

| | | | |
|---|---|---|---|
| JP | 2019-45609 | A | 3/2019 |
| JP | 2020-529729 | A | 10/2020 |
| KR | 10-2020-0145951 | A | 12/2020 |
| WO | 2016/079023 | A1 | 5/2016 |
| WO | 2019/027820 | A1 | 2/2019 |

OTHER PUBLICATIONS

Office Action issued Jan. 9, 2025 by the Korean Patent Office for KR Patent Application No. 10-2021-0181734.
Communication dated May 9, 2023, issued by the European Patent Office in European Application No. 22206435.4.

* cited by examiner 312
310

COLOR CONVERSION STRUCTURE, DISPLAY APPARATUS, AND METHOD OF MANUFACTURING COLOR CONVERSION STRUCTURE

CROSS-REFERENCE TO RELATED APPLICATION

This application is based on and claims priority under 35 U.S.C. § 119 to Korean Patent Application No. 10-2021-0181734, filed on Dec. 17, 2021, in the Korean Intellectual Property Office, the disclosure of which is incorporated by reference herein in its entirety.

BACKGROUND

1. Field

The disclosure relates to a color conversion structure configured to be transferable to a display substrate, a display apparatus, and a method of manufacturing a color conversion structure.

2. Description of the Related Art

Liquid crystal displays (LCDs) and organic light-emitting diode (OLED) displays are widely used as display apparatuses. Recently, technology for manufacturing a high-resolution display apparatus by using a micro light-emitting diode has been in the spotlight.

In order to manufacture a display using a micro light-emitting device, many different methods may be required, such as a method of moving a micro light-emitting device to a desired display pixel position, a repair method, and a method of realizing a desired color.

SUMMARY

Provided is a color conversion structure configured to be transferable to a display substrate.

Provided is a display apparatus including a color conversion structure configured to be transferable to a display substrate.

Provided is a method of manufacturing a color conversion structure configured to be transferable to a display substrate.

Additional aspects will be set forth in part in the description which follows and, in part, will be apparent from the description, or may be learned by practice of the presented example embodiments.

According to an aspect of the disclosure, there is provided a color conversion structure including: a bank structure including a groove having a bottom surface and an upper opening; a color conversion layer provided in the groove and contacting the bottom surface of the groove; and a cover layer provided on the color conversion layer.

The color conversion structure may include a reflective layer provided on a sidewall of the bank structure.

The cover layer may include a distributed Bragg reflective layer.

The bank structure may include a bottom layer and a sidewall, and the bottom layer may include a distributed Bragg reflective layer.

The groove may have a curved surface.

The cover layer may have a convex curved surface.

The color conversion layer may include a first color conversion layer configured to convert incident light into first color light, and a second color conversion layer configured to convert the incident light into second color light.

An upper surface of the cover layer may include an uneven structure.

A thickness of the color conversion layer may be less than a depth of the groove.

A thickness of the color conversion layer may range from 10 μm to 15 μm.

The color conversion layer may have a structure in which quantum dots are embedded in a porous layer.

The porous layer may include n-GaN.

According to another aspect of the disclosure, there is provided a display apparatus including: a display substrate; a plurality of micro semiconductor chips provided on the display substrate to be spaced apart from each other; and a color conversion structure provided on each of the plurality of micro semiconductor chips, wherein the color conversion structure includes: a bank structure including a groove having a bottom surface and an upper opening, a color conversion layer providing in the groove and contacting the bottom surface of the groove, and a cover layer provided on the color conversion layer.

The cover layer may be located adjacent to the respective micro semiconductor chip to face the respective micro semiconductor chip.

The color conversion structure may further include a reflective layer provided on a sidewall of the bank structure.

The cover layer may be a distributed Bragg reflective layer.

The bank structure may include a bottom layer and a sidewall, and the bottom layer is a distributed Bragg reflective layer.

The groove may have a curved surface.

The cover layer may have a convex curved surface.

An upper surface of the cover layer may include an uneven structure.

A thickness of the color conversion layer may range from 10 μm to 15 μm.

According to another aspect of the disclosure, there is provided a method of manufacturing a color conversion structure, the method including: forming a first layer on a first substrate; forming a plurality of grooves on the first layer, each of the plurality of grooves including a bottom surface and an upper opening in the first layer; forming a color conversion layer in each of the plurality of grooves; forming a cover layer on the color conversion layer; forming a bank structure by etching the cover layer and the first layer between adjacent grooves, among the plurality of grooves; and removing the first substrate.

The method may further include forming a reflective layer on a sidewall of the bank structure.

The cover layer may be a distributed Bragg reflective layer.

The bank structure may include a bottom layer and a sidewall, and the bottom layer is a distributed Bragg reflective layer.

The grooves may have a curved surface.

The cover layer may have a convex curved surface.

According to another aspect of the disclosure, there is provided a color conversion structure including: a first layer; a color conversion layer provided on the first layer; a first sidewall provided on a first side of the color conversion layer; a second sidewall provided on a second side of the color conversion layer; a cover layer provided on the color conversion layer, the first sidewall and the second sidewall.

The first layer and the first and second sidewalls may be a one-piece structure.

According to another aspect of the disclosure, there is provided a method of manufacturing display apparatus, the method comprising: transferring a micro semiconductor chips on a display substrate comprising a driving circuit; and transferring a color conversion structure on the micro semiconductor chips; wherein the color conversion structure comprises a bank structure comprising a groove comprising a bottom surface and an upper opening, a color conversion layer contacting the bottom surface of the groove, and a cover layer provided on the quantum dot color conversion layer.

BRIEF DESCRIPTION OF THE DRAWINGS

The above and other aspects, features, and advantages of certain example embodiments will be more apparent from the following description taken in conjunction with the accompanying drawings, in which.

DETAILED DESCRIPTION

Figure 1:
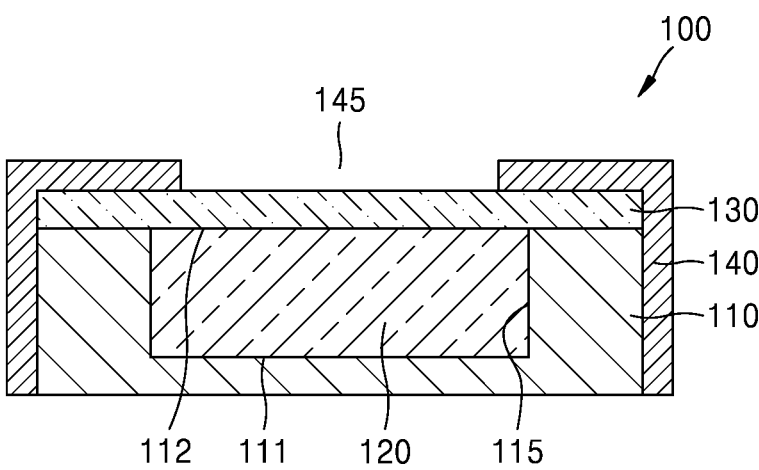
FIG. 1 is a cross-sectional view illustrating a color conversion structure, according to an example embodiment.

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a color conversion structure, a display apparatus, and a method of manufacturing a color conversion structure according to various example embodiments will be described in detail with reference to the accompanying drawings. Like reference numerals denote like elements throughout, and in the drawings, sizes of elements may be exaggerated for clarity and convenience of explanation. It will be understood that although the terms "first," "second," etc. may be used herein to describe various elements, these elements should not be limited by these terms. The above terms are used only to distinguish one component from another.

The singular forms "a," "an," and "the" are intended to include the plural forms as well, unless the context clearly indicates otherwise. When a portion "includes" an element, another element may be further included, rather than excluding the existence of the other element, unless otherwise described. Sizes or thicknesses of elements may be exaggerated for clarity of explanation. It will also be understood that when a material layer is referred to as being "on" another layer or a substrate, the material layer may be directly on the other layer or the substrate, or intervening layers may also be present therebetween. A material of each layer in the following example embodiments is merely an example, and thus, other materials may be used.

The term used in the example embodiments such as "unit" or "module" indicates a unit for processing at least one function or operation, and may be implemented in hardware, software, or in a combination of hardware and software.

Specific execution methods described in the present example embodiment are examples, and a technical scope is not limited by any method. For the sake of brevity, conventional electronics, control systems, software, and other functional aspects of the systems may not be described in detail. Also, lines or members connecting elements illustrated in the drawings are merely illustrative of functional connections and/or physical or circuit connections. In an actual device, the connections between elements may be represented by various functional connections, physical connections, or circuit connections that are replaceable or added.

The use of the terms "a" and "an," and "the" and similar referents in the context of describing the disclosure is to be construed to cover both the singular and the plural.

The operations of all methods described herein may be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed.

FIG. 1 is a view illustrating a color conversion structure, according to an example embodiment.

According to an example embodiment, a color conversion structure 100 includes a bank structure 110 including a groove 115, a color conversion layer 120 provided in the groove 115, and a cover layer 130 provided on the color conversion layer 120. The bank structure 110 may have a structure in which the color conversion layer 120 may be received, and the color conversion layer 120 may be easily manufactured to have a desired thickness based on the bank structure 110. The groove 115 may include a bottom surface 111 and an upper opening 112. The color conversion layer 120 may contact the bottom surface 111 of the groove 115. According to an example embodiment, the color conversion structure may be a color conversion film. However, the disclosure is not limited thererto.

The bank structure 110 may include an etchable material such as GaN, $SiO_2$, $TiO_2$, SiN, polymethyl methacrylate (PMMA), or photoresist. The cover layer 130 may cover the color conversion layer 120. According to an example embodiment, the cover layer 130 may include a light-transmitting material through which light emitted from the color conversion layer 120 is transmitted. The cover layer 130 may include at least one of GaN, $SiO_2$, $AL_2O_3$, $TiO_2$, glass, sea of gate (SOG), SiN, and polymethyl methacrylate (PMMA). The cover layer 130 may protect the color conversion layer 120 from an external environment. For example, because quantum dots are vulnerable to moisture, the cover layer 130 may cover the color conversion layer 120 to improve reliability, reduce consumption of quantum dots, and increase price competitiveness.

Also, the cover layer 130 may have a greater roughness than that of a surface of the bank structure 110, and may have relatively large surface energy. Accordingly, when the color conversion structure 100 is wet transferred to a transfer substrate, self-transfer may be performed due to a surface energy difference. As descried below, because the color conversion structure 100 has a film structure, the color conversion structure 100 may be wet transferred to the transfer substrate.

The color conversion layer 120 may include quantum dots. The quantum dots are inorganic materials having a size of several nm, and may have an energy bandgap of a certain wavelength, and thus, when light of a higher energy than the energy bandgap is absorbed, light of a different wavelength may be emitted. Because quantum dots have a narrow emission wavelength band, color reproduction of a display may be improved. However, when quantum dots directly contact a light source (e.g., an ultraviolet (UV) or blue light-emitting diode (LED)), the quantum dots are very unstable, and thus, a color conversion rate may be lowered. When quantum dots are exposed to strong light or subjected to thermal shock, the characteristics of the quantum dots tend to be rapidly reduced. Accordingly, quantum dots normally operate when they are spaced apart from a light source by a certain distance. According to an example embodiment, the color conversion layer 120 may be spaced apart from a light source due to the cover layer 130 or the bottom surface 111 of the bank structure 110, and as such, the characteristics of the quantum dots may be prevented from being reduced by light from the light source.

The color conversion layer 120 may have, for example, a film structure in which quantum dots are distributed in a photoresist. The quantum dots may have a core-shell structure including a core and a shell, or may have a particle structure with no shell. The core-shell structure may be a single-shell or multi-shell structure, for example, a double-shell structure.

The quantum dots may include group II-VI semiconductors, group III-V semiconductors, group IV-VI semiconductors, group IV semiconductors, and/or graphene quantum dots. The quantum dots may include, for example, Cd, Se, Zn, S, and/or InP, and each quantum dot may have a diameter of tens of nm or less, for example, a diameter of about 10 nm or less. The quantum dots may be excited by blue light to emit green light or red light according to a material or a size thereof.

Also, in order to obtain sufficient light conversion characteristics, a thickness of the color conversion structure 100 including a light conversion material should be a certain level or more. This is because when the thickness is insufficient, leakage of excitation light occurs. As a thickness of the color conversion structure 100 increases, the intensity of converted light may increase and the intensity of excitation light may decrease. The color conversion layer 120 may have a thickness ranging from about 10 μm to about 15 μm, and in this case, leakage of excitation light may be reduced and a decrease in the intensity of excitation light may be prevented.

In order to increase a thickness of the color conversion layer 120, the color conversion layer 120 may be formed as a colloidal film on the bank structure 110.

In a micro light-emitting device display, green and red micro light-emitting devices have lower luminous efficiency and are more expensive than a blue micro light-emitting device. Accordingly, when a color image is displayed by converting blue light emitted from the blue micro light-emitting device into green light or red light by using a color conversion structure, luminous efficiency may be improved and manufacturing costs may be reduced.

The color conversion structure according to an example embodiment may have a film structure capable of improving the reliability of the color conversion layer, improving light conversion efficiency, and being transferred to a display apparatus.

Referring to FIG. 1, a reflective layer 140 may be provided on a sidewall of the bank structure 110. The reflective layer 140 may reflect inward light emitted from the color conversion layer 120, to reduce leakage of light to a side of the color conversion structure 100 or in an undesired direction. The reflective layer 140 may increase a color conversion rate by increasing internal reflection of blue light for excitation, and may prevent light from being interfered (mixed) with an adjacent sub-pixel region. Although not shown, the reflective layer 140 may be provided on an inner wall of the groove 115.

The reflective layer 140 may include, but is not limited to, silver (Ag), gold (Au), platinum (Pt), nickel (Ni), chromium (Cr), and/or aluminum (Al). The reflective layer 140 may be provided on a portion other than a window area 145 so that light is emitted to an upper portion of the bank structure 110. For example, the window area 145 may be provided over the color conversion layer 120, and the window area 145 may be limited to a portion with no reflective layer 140. The reflective layer 140 may be provided on a side portion of the bank structure 110, or may be provided on a side portion of the bank structure 110 and a part of an upper portion of the bank structure 110.

Figure 2:
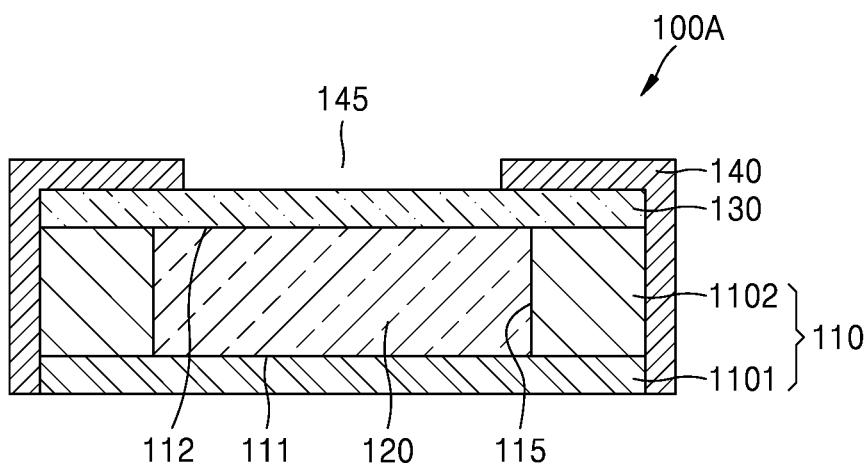
FIG. 2 is a cross-sectional view illustrating a color conversion structure, according to another example embodiment.

FIG. 2 is a view illustrating a modified example of the bank structure of the color conversion structure of FIG. 1 according to another example embodiment. In FIG. 2, a color conversion structure 100A is provided, and the same elements as those in the color conversion structure 100 of FIG. 1 are denoted by the same reference numerals, and thus, a detailed description thereof will be omitted.

The bank structure 110 may include a bottom layer 1101 and a sidewall 1102. While the bank structure 110 has an integrated structure in FIG. 1, in FIG. 2, the bottom layer 1101 and the sidewall 1102 are provided as separate bodies. According to an example embodiment, the bottom layer 1101 and the sidewall 1102 may be formed of different materials. However, the disclosure is not limited thereto, and the bottom layer 1101 and the sidewall 102 may be formed of the same material. The color conversion layer 120 is surrounded by the bottom layer 1101 and the sidewall 1102.

Figure 3:
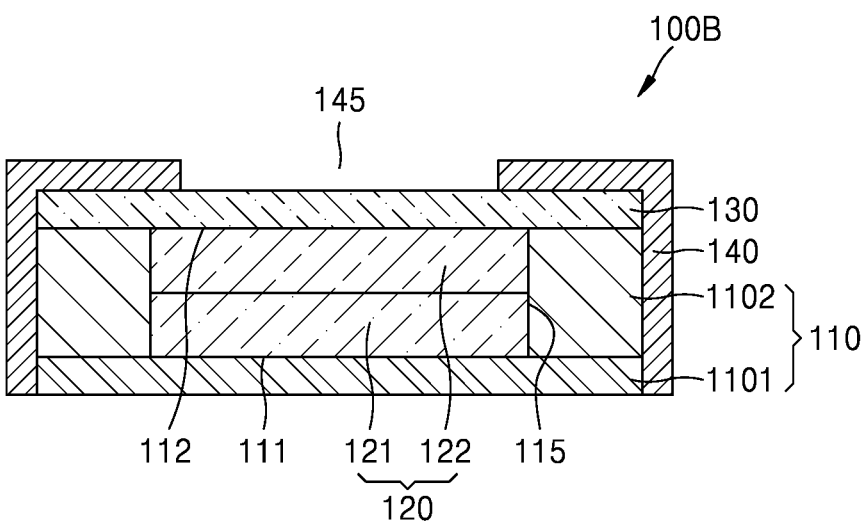
FIG. 3 is a view illustrating an example where the color conversion structure of FIG. 2 includes two color conversion layers.

FIG. 3 is a view illustrating a modified example of the color conversion layer of the color conversion structure of FIG. 2. In FIG. 3, a color conversion structure 100B is provided, and the same elements as those in the color conversion structure 100A of FIG. 2 are denoted by the same reference numerals, and thus, a detailed description thereof will be omitted.

The color conversion layer 120 of a color conversion structure 100B may include a first color conversion layer 121 and a second color conversion layer 122. The first color conversion layer 121 may convert a wavelength of incident light into a first wavelength, for example, a red wavelength, and the second color conversion layer 122 may convert a wavelength of incident light into a second wavelength, for example, a green wavelength. As such, because the color conversion layer 120 includes two layers, the number of sub-pixels included in one pixel may be reduced and a size of a display apparatus may be reduced. According to another example embodiment, the color conversion layer 120 of a color conversion structure 100 in FIG. 1 may also include the first color conversion layer 121 and the second color conversion layer 122.

Figure 4:
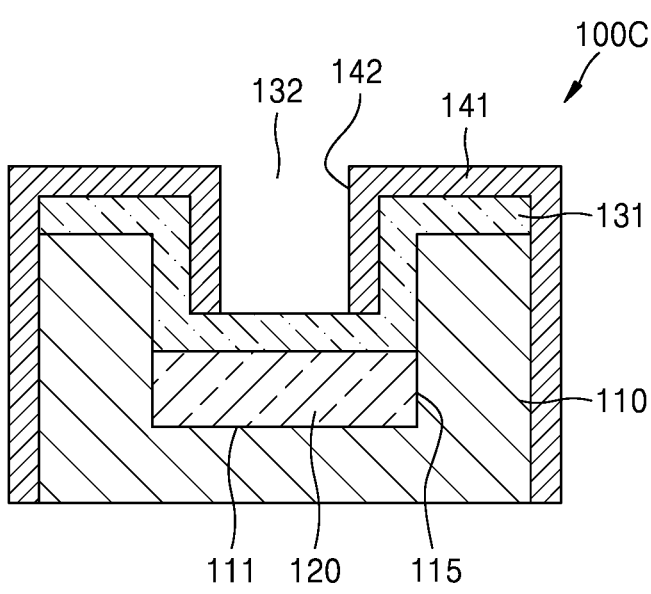
FIG. 4 is a view illustrating an example where a thickness of a color conversion layer included in a groove in the color conversion structure of FIG. 1 is less than a depth of the groove.

FIG. 4 is a view illustrating a color conversion structure 100C according to another example embodiment, where a thickness of the color conversion layer 120 conversion structure is less than a depth of the groove 115. According to an example embodiment, the color conversion structure 100C includes a color conversion layer 120, which may be filled only to a certain depth of the groove 115, a reflective layer 141 may be provided on a sidewall and an upper portion of the bank structure 110, and an extending portion

142 extending to the inside of the groove 115 may be further provided. That is, the extending portion 142 may also be a reflective layer made of a reflective material. An opening 132 surrounded by the extending portion 142 may be provided. A micro semiconductor chip described below may be accommodated in the opening 132.

FIGS. 5A through 5D are views illustrating various examples of the cover layer 130 according to example embodiments.

Figure 5A:
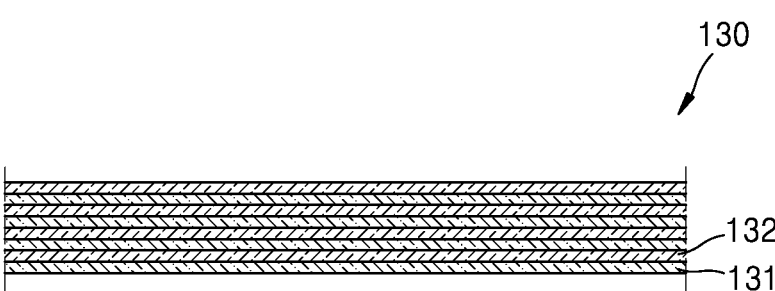
FIG. 5A is a view illustrating an example where a cover layer of a color conversion structure includes a distributed Bragg reflective layer, according to an example embodiment.

Referring to FIG. 5A, the cover layer 130 may include a distributed Bragg reflective layer in which a first layer 131 having a first refractive index and a second layer 132 having a second refractive index are alternately arranged with each other. A wavelength of reflected light may be set according to thicknesses and materials of the first layer 131 and the second layer 132. When the cover layer 130 includes a distributed Bragg reflective layer, light of a color converted by the color conversion layer 120 may be transmitted and light of another color may be reflected to be recycled, thereby increasing a color conversion rate.

Figure 5B:
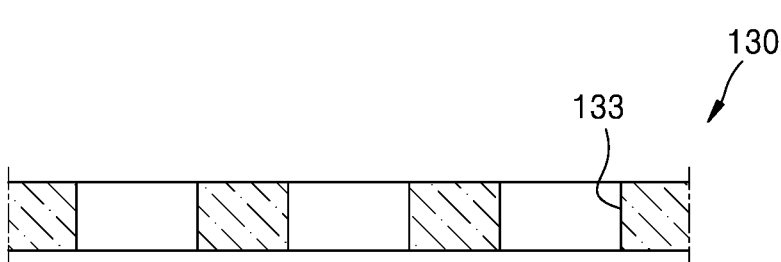
FIG. 5B is a view illustrating an example where a cover layer of a color conversion structure has a regular hole pattern structure, according to an example embodiment.

Referring to FIG. 5B, the cover layer 130 may include a plurality of holes 133, and a pattern in which the plurality of holes 133 are regularly arranged.

Figure 5C:
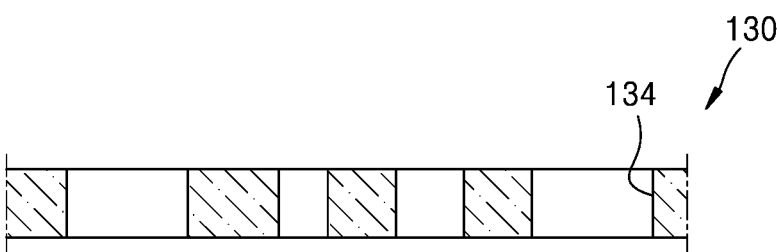
FIG. 5C is a view illustrating an example where a cover layer of a color conversion structure has an irregular hole pattern structure, according to an example embodiment.

Referring to FIG. 5C, the cover layer 130 may include a plurality of holes 134, and a pattern in which the plurality of holes 134 are irregularly arranged. As such, when an engraved or embossed pattern is formed on the cover layer 130, the light extraction efficiency of converted light may be improved and light trapping may be effectively removed. The cover layer 130 may have a two-dimensional (2D) photonic crystal structure or a meta-structure. The hole 134 may have a size smaller than a wavelength of used light.

Figure 5D:
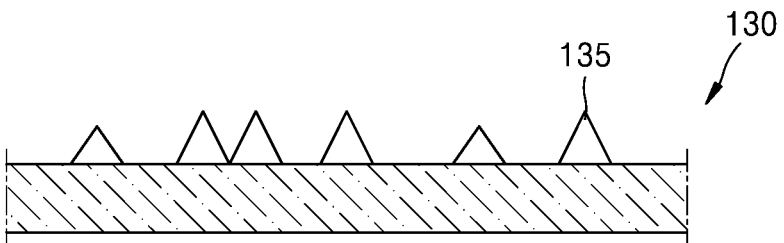
FIG. 5D is a view illustrating an example where a cover layer of a color conversion structure has an uneven structure, according to an example embodiment.

Referring to FIG. 5D, an uneven structure 135 may be further provided on the cover layer 130. According to an example embodiment, because the uneven structure 135 makes a roughness of an upper portion of the color conversion structure 100 greater than a roughness of a lower portion, when the color conversion structure 100 is transferred to a transfer substrate, the uneven structure 135 may guide position of the upper portion and the lower portion of the color conversion structure 100 in the transfer substrate. For example, when the color conversion structure 100 is transferred, fluidic self-assembly may be performed due to a roughness difference between a top surface and a bottom surface of the color conversion structure 100. The uneven structure 135 may include a material having a refractive index different from that of the cover layer 130. For example, the uneven structure 135 may be formed of a material having a refractive index higher than that of the cover layer 130.

Figure 6:
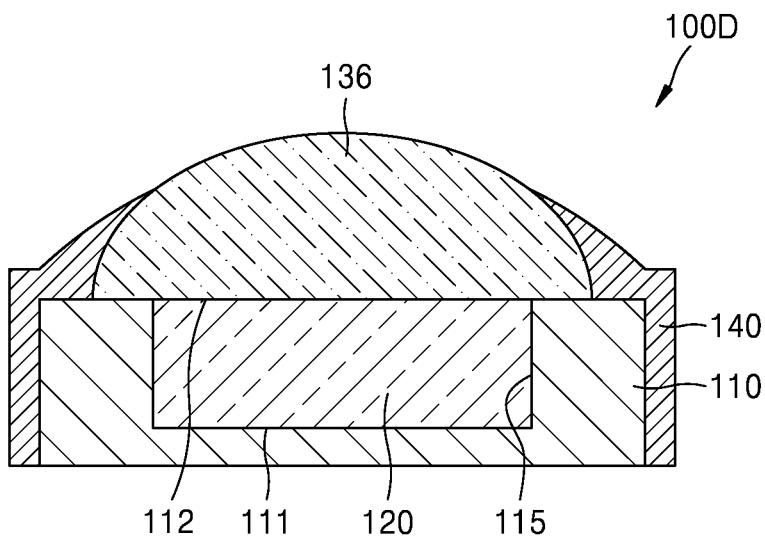
FIG. 6 is a view illustrating an example where a cover layer of a color conversion structure has a convex shape, according to an example embodiment.

FIG. 6 is a view illustrating a modified example of the cover layer in the color conversion structure of FIG. 1 according to another example embodiment.

In FIG. 6, a cover layer 136 of a color conversion structure 100D may include a convex curved surface. The cover layer 136 may be provided over the color conversion layer 120 and may operate like a convex lens.

Figure 7:
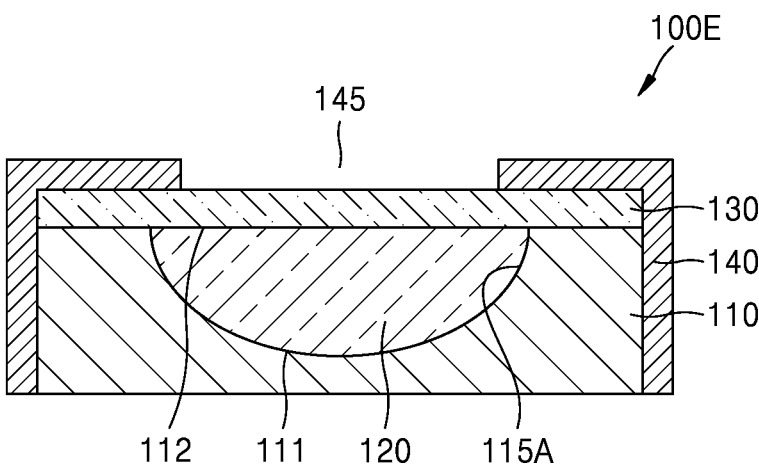
FIG. 7 is a view illustrating an example where a groove of a color conversion structure has a concave curved shape, according to an example embodiment.

FIG. 7 is a view illustrating a modified example of the groove in the color conversion structure of FIG. 1. In FIG. 7, a groove 115A of a color conversion structure 100E may have a curved surface. The groove 115A may have a downward concave shape. The color conversion layer 120 may have a hemispherical shape corresponding to the shape of the groove 115A. A direction in which light converted by the color conversion layer 120 is output may be adjusted according to the shape of the color conversion layer 120.

As described above, because the color conversion structure according to an example embodiment includes a color conversion layer on a banking structure, a thickness of the color conversion layer may be easily adjusted and light efficiency may be improved or transfer efficiency may be improved by modifying a structure of a cover layer in various ways.

FIGS. 8A through 8G are views illustrating a method of manufacturing a color conversion structure, according to an example embodiment.

Figure 8A:
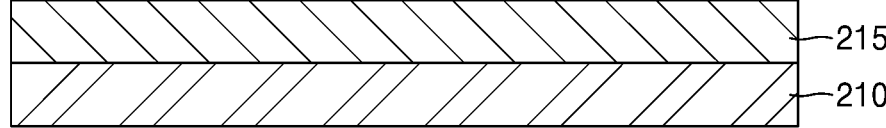
FIGS. 8A through 8G are views for describing a method of manufacturing a color conversion structure, according to an example embodiment.

Referring to FIG. 8A, a first layer 215 is formed on a first substrate 210. The first substrate 210 for supporting the first layer 215 is removed later. The first substrate 210 may include a sapphire substrate or a glass substrate. The first layer 215 may include, for example, GaN, $SiO_2$, $TiO_2$, SiN, polymethyl methacrylate (PMMA), or photoresist.

Figure 8B:
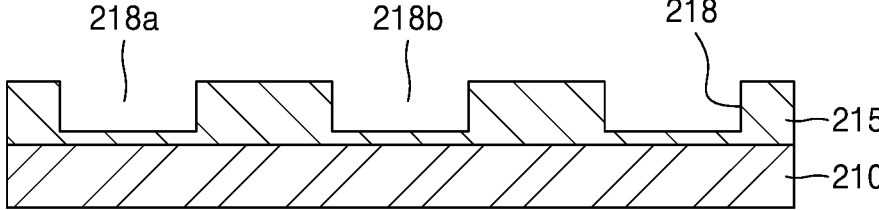

Referring to FIG. 8B, a groove 218 is formed by etching the first layer 215. The groove 218 may include a bottom surface 218a and an upper opening 218b. The first layer 215 may be etched to a depth at which the first substrate 210 is not exposed. A depth of the groove 218 may be determined according to a thickness of a color conversion layer to be accommodated in the groove 218.

Figure 8C:
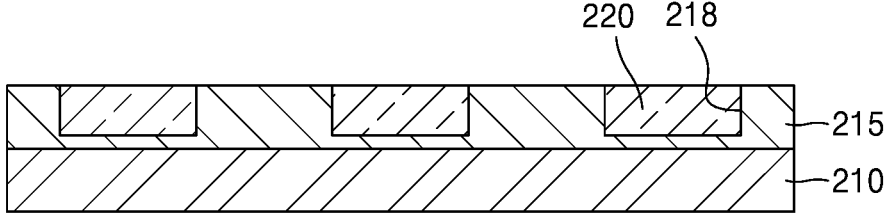

Referring to FIG. 8C, a color conversion layer 220 is formed in the groove 218. The color conversion layer 220 may be rapidly filled in a wide area through a spin coating method or a slit coating method. The color conversion layer 220 may include quantum dots capable of converting a wavelength of incident light. For example, the color conversion layer 220 may include quantum dots that are excited by blue light to emit green light, or may include quantum dots that are excited by light to emit red light. A converted wavelength may vary according to a size or a material of the quantum dots. The color conversion layer 220 may have a structure in which quantum dots for color conversion are embedded in a porous layer. The color conversion layer 220 may include n-GaN. The porous layer may be formed by stacking n-GaN in the groove 218 and etching the n-GaN by using an electrochemical etching method. When the porous layer is immersed in a quantum dot liquid, the quantum dots may be embedded in the porous layer. When the quantum dots are embedded in the porous layer, the light scattering effect of light entering the color conversion layer 220 may be increased, and thus, color conversion efficiency may be improved. The color conversion layer 220 may be formed to be accommodated in the groove 218, and a thickness of the color conversion layer 220 may be determined according to a depth of the groove 218.

Figure 8D:
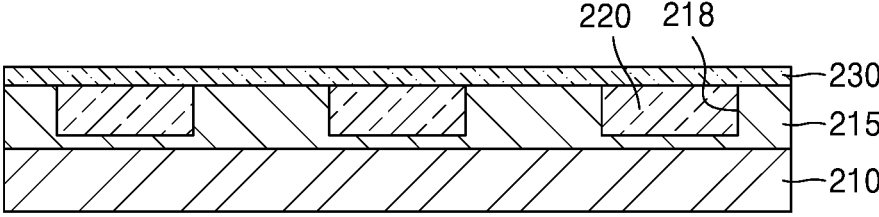

Referring to FIG. 8D, a cover layer 230 covering the color conversion layer 220 and the first layer 215 may be formed. The cover layer 230 may include a material through which light is transmitted. The cover layer 230 may include at least one of, for example, GaN, $SiO_2$, $AL_2O_3$, $TiO_2$, glass, sea of gate (SOG), SiN, and polymethyl methacrylate (PMMA).

According to an example embodiment, because the cover layer 230 is applied on the color conversion layer 220 and the first layer 215, a structure or a shape of the cover layer 230 may be implemented in various ways. For example, when the cover layer 230 includes a distributed Bragg reflective layer, the cover layer 230 may be formed by alternately stacking two layers having different refractive indexes as illustrated in FIG. 5A. Alternatively, a hole may be formed in the cover layer 230 as illustrated in FIGS. 5B or FIG. 5C, or an uneven structure as illustrated in FIG. 5D may be formed on the cover layer 230.

Figure 8E:
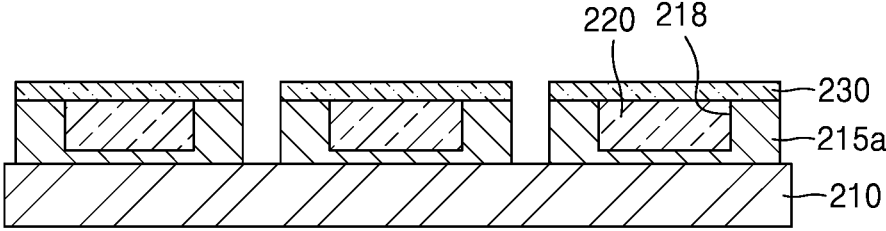

Referring to FIG. 8E, the cover layer 230 and the first layer 215 between the color conversion layers 220 are etched to expose the first substrate 210. As such, the first layer 215 may become a bank structure 215a.

Figure 8F:
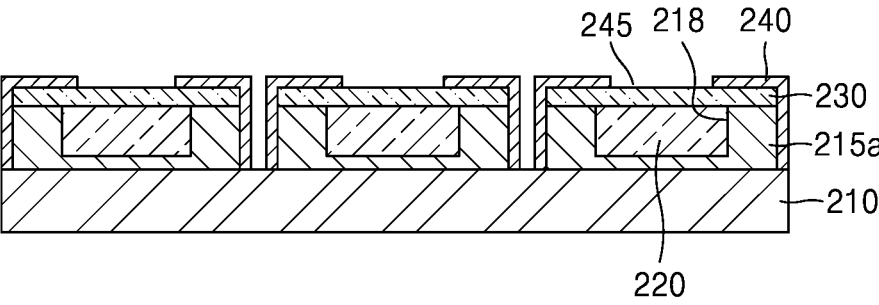

Referring to FIG. 8F, a reflective layer 240 is stacked on the structure of FIG. 8E. According to an example embodiment, the reflective layer 240 is provided on a side surface of the bank structure 215a and on top of the cover layer 230. A window area 245 may be formed by etching a portion of the reflective layer 240 facing the color conversion layer 220.

Figure 8G:
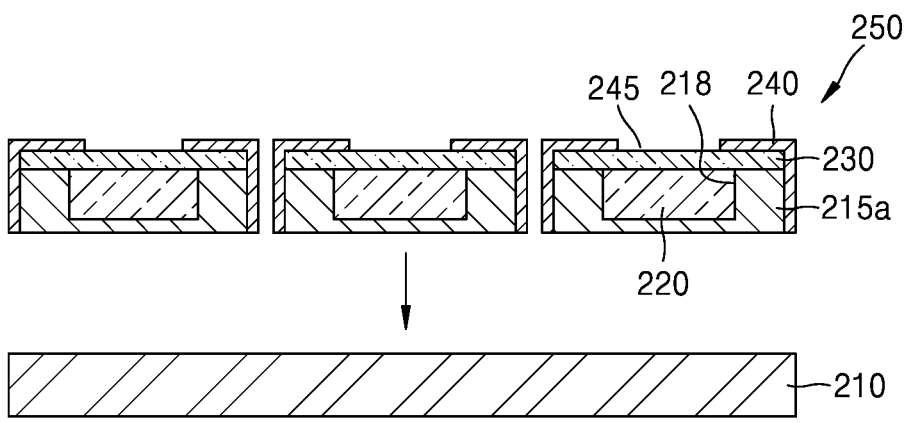

Referring to FIG. 8G, a plurality of color conversion structures 250 may be separated by removing the first substrate 210 from the bank structure 215a. The color conversion structure 250 may include the color conversion layer 220 having a certain thickness in the bank structure 215a. The color conversion layer 220 may have a thickness ranging from about 10 μm to about 15 μm. The color conversion structure 250 may be transferred in units of sub-pixels of a display apparatus.

FIGS. 9A through 9F are views illustrating a method of manufacturing a color conversion structure, according to another example embodiment.

Figure 9A:
FIGS. 9A through 9F are views for describing a method of manufacturing a color conversion structure, according to another example embodiment.

Referring to FIG. 9A, a first layer 312 is deposited on a first substrate 310. The first layer 312 may be, for example, a distributed Bragg reflective layer. The first layer 312 may have a structure in which at least two layers from among $SiO_2$, $TiO_2$, ZnO, ZrO, $Ta_2O_3$, SiN, and AlN are repeatedly arranged. When the first layer 312 is formed as a distributed Bragg reflective layer, the distributed Bragg reflective layer may be configured to reflect blue light and transmit red light or green light. Alternatively, the distributed Bragg reflective layer may be configured to transmit blue light and reflect red light or green light, according to a position of the first layer 312. The distributed Bragg reflective layer may have a structure in which a first refractive index layer and a second refractive index layer are alternately stacked with each other as shown in FIG. 5A, and a reflected wavelength and a transmitted wavelength may be adjusted by adjusting the thickness, number, and refractive index of the first refractive index layer and the second refractive index layer.

Figure 9B:
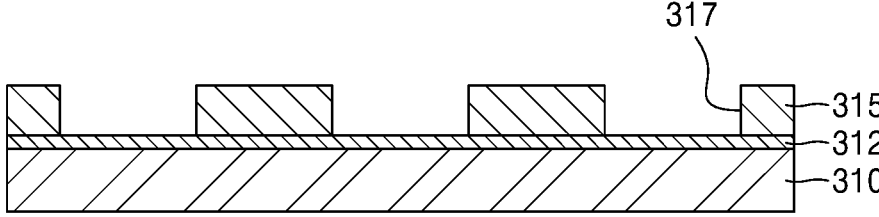

Referring to FIG. 9B, a second layer 315 may be formed on the first layer 312, and a groove 317 may be formed by etching the second layer 315. The second layer 315 may be etched therethrough, and the groove 317 may be formed by the first layer 312 and the second layer 315.

Figure 9C:
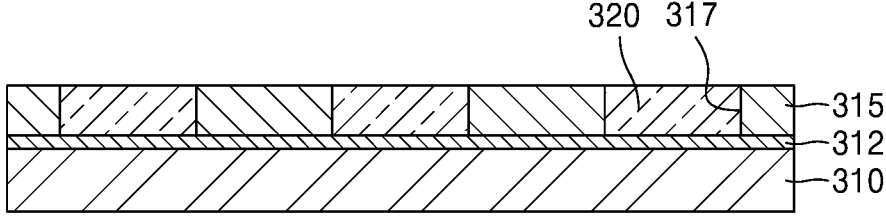

Referring to FIG. 9C, a color conversion layer 320 is formed in the groove 317. The color conversion layer 320 may be formed by using the same method as described above.

Figure 9D:
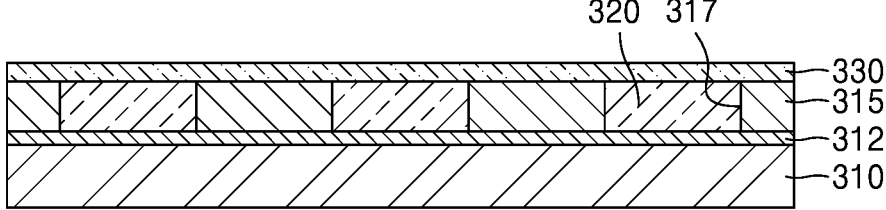

Referring to FIG. 9D, a cover layer 330 may be formed to cover the second layer 315 and the color conversion layer 320. Various structures of the cover layer 330 which are the same as described above may be applied.

Figure 9E:
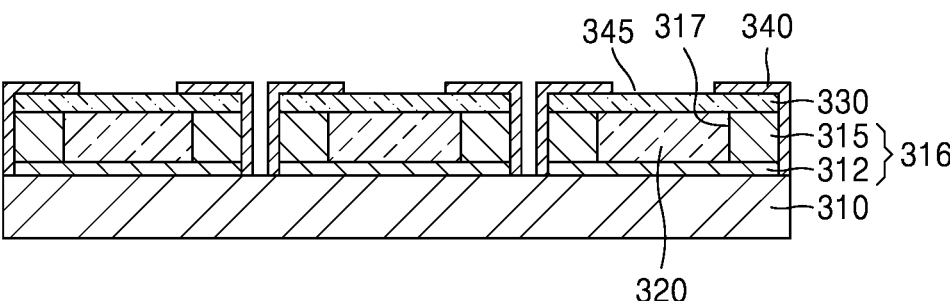

Referring to FIG. 9E, the cover layer 330, the second layer 315, and the first layer 312 between the color conversion layers 320 are etched and isolated to expose the first substrate 310. As such, the first layer 312 and the second layer 315 may become a bank structure 316. A reflective layer 340 is stacked on a sidewall of the second layer 315 and the cover layer 330. Next, a window area 345 may be formed by etching a portion of the reflective layer 340 facing the color conversion layer 320.

Figure 9F:
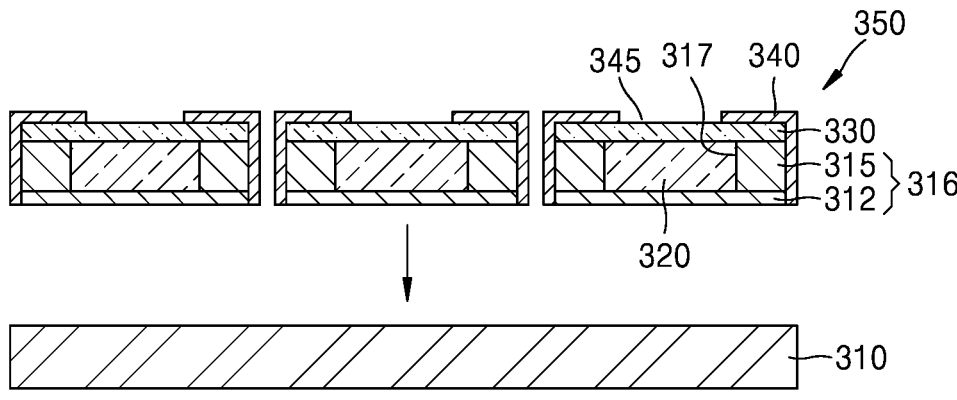

Referring to FIG. 9F, a plurality of color conversion structures 350 may be separated by removing the first substrate 310 from the bank structure 316.

A method of manufacturing a display apparatus according to an example embodiment will now be described.

Figure 10:
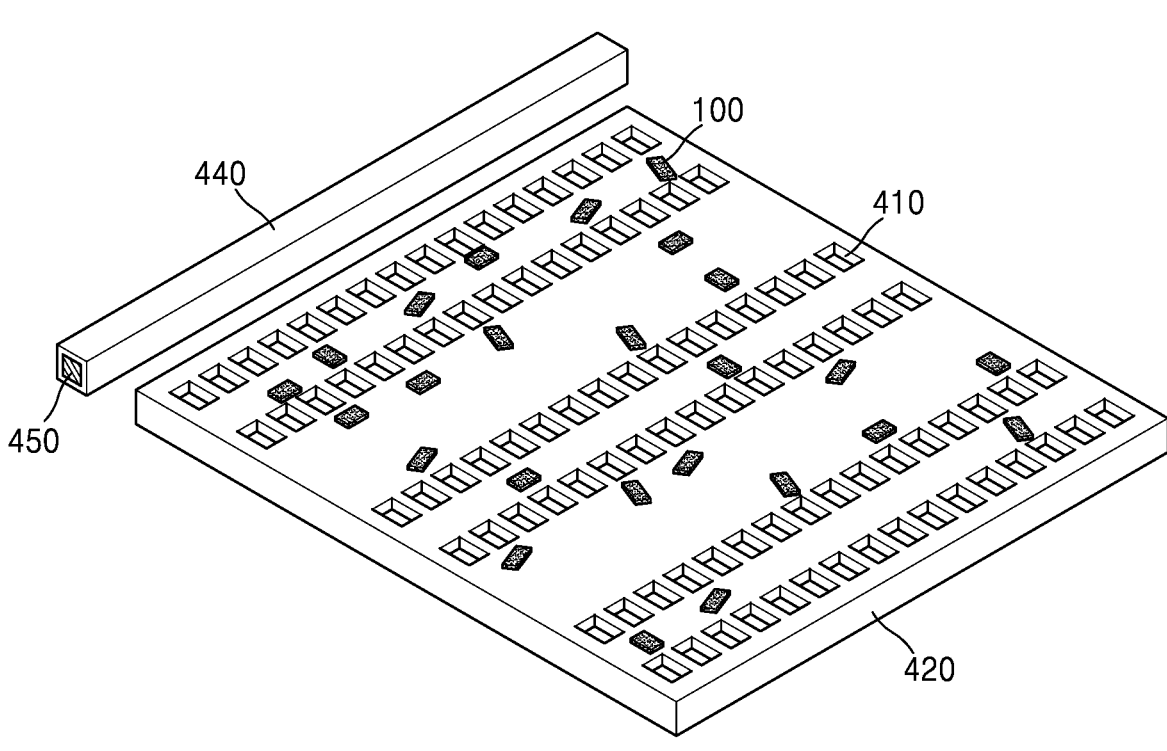
FIGS. 10 and 11 are views illustrating a method of transferring a color conversion structure to a transfer substrate, according to an example embodiment.

FIG. 10 is a view for illustrating a method of wet transferring a color conversion structure. Referring to FIG. 10, a transfer substrate 420 may include a plurality of grooves 410 into which the color conversion structure 100 may be inserted. Each of the plurality of grooves 410 may have a size sufficient to insert at least a part of the color conversion structure 100. For example, the groove 410 may have a size in micro units. For example, a size of the groove 410 may be less than 1000 μm. According to an example embodiment, the size of the groove 410 may be 500 μm or less, 200 μm or less, or 100 μm or less. According to an example embodiment, a size of the groove 410 may be greater than a size of the color conversion structure 100.

A liquid is supplied into the groove 410. The liquid may be any liquid as long as the liquid does not corrode or damage the color conversion structure 100. The liquid may include one of, for example, water, ethanol, alcohol, polyol, ketone, halocarbon, acetone, flux, and an organic solvent, or a combination thereof. The organic solvent may include, for example, isopropyl alcohol (IPA). However, the usable liquid is not limited thereto, and various modifications may be made.

According to an example embodiment, a method of supplying the liquid to the groove 410 may be any of various methods such as a spray method, a dispensing method, an inkjet dot method, or a method of flowing the liquid to the transfer substrate 420, which will be described below. The amount of liquid supplied may be adjusted in various ways so that the liquid is supplied to fit the groove 410 or to overflow from the groove 410.

According to an example embodiment, a plurality of color conversion structures 100 are supplied to the transfer substrate 420. The color conversion structure 100 may be directly sprayed onto the transfer substrate 420 without any other liquid, or may be supplied in a suspension. A method of supplying the color conversion structure 100 in the suspension may be any of various methods such as a spray method, a dispensing method of dispensing liquid droplets, an inkjet dot method of ejecting a liquid as in a printing method, or a method of flowing the suspension to the transfer substrate 420.

After the liquid is supplied to the transfer substrate 420, the transfer substrate 420 is scanned with an absorber 450 capable of absorbing the liquid. The absorber 450 may be any material as long as the material is capable of absorbing the liquid, and a shape or a structure of the absorber 450 is not limited. The absorber 450 may include, for example, fabric, tissue, polyester fiber, paper, or wiper. The absorber 450 may be used alone without another auxiliary device, but the disclosure is not limited thereto. The absorber 450 may be coupled to a support 440 for convenient scanning of the transfer substrate 420. The support 440 may have any of various shapes and structures suitable for scanning the transfer substrate 420. The support 440 may have a shape such as a rod, a blade, a plate, or a wiper. The absorber may be provided on a surface of the support 440, or may surround the support 440.

The absorber 450 may scan the transfer substrate 420 while pressing the transfer substrate 420 at an appropriate pressure. The scanning may include a operation of absorbing the liquid while the absorber 420 contacts the transfer substrate 420 and passes through the plurality of grooves 410. The scanning may be performed by using any of various methods such as a sliding method, a rotating method, a translating method, a reciprocating method, a rolling method, a spinning method, and/or a rubbing method of the absorber 450, and may include a regular method or an irregular method. The scanning may be performed by moving the transfer substrate 420, instead of moving the absorber 450, and the scanning of the transfer substrate 420 may also be performed by using any of methods such as sliding, rotating, translating, reciprocating, rolling, spinning, and/or rubbing. The scanning may also be performed by cooperation of the absorber 450 and the transfer substrate 420.

According to an example embodiment, the operation of supplying the liquid to the groove 410 of the transfer substrate 420 and the operation of supplying the color conversion structure 100 to the transfer substrate 420 may be performed in reverse order. Also, the operation of supplying the liquid to the groove 410 of the transfer substrate 420 and the operation of supplying the color conversion structure 100 to the transfer substrate 420 may be simultaneously performed in one step. For example, a suspension in which the color conversion structure 100 is contained may be supplied to the transfer substrate 420 to simultaneously supply the liquid and the color conversion structure 100 to the transfer substrate 420.

After the transfer substrate 420 is scanned with the absorber 450, a dummy color conversion structure remaining on the transfer substrate 420 without entering the groove 410 may be removed. Through the above operations, the color conversion structure 100 may be rapidly transferred to the transfer substrate 420.

Figure 11:
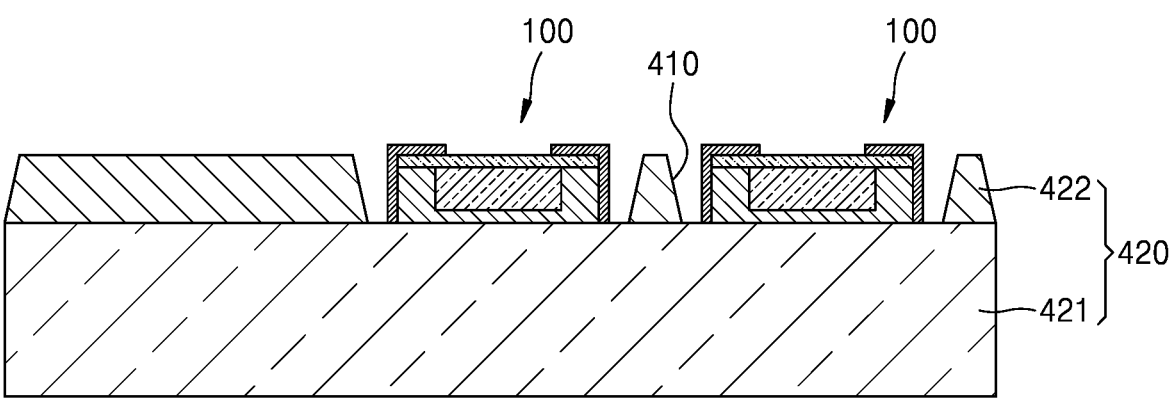

FIG. 11 is a view illustrating a case where the transfer substrate 420 includes a plurality of layers. For example, the transfer substrate 420 may include a base substrate 421 and a guide mold 422. Materials of the base substrate 421 and the guide mold 422 may be different from each other or may be the same. The color conversion structure 100 is transferred to the groove 410. A roughness of a bottom surface of the bank structure 110 of the color conversion structure 100 may be less than a roughness of the reflective layer 140 or a top surface of the cover 130 of the color conversion structure 100. In this case, when the color conversion structure 100 is transferred to the transfer substrate 420, due to interaction with a liquid, a side having a small roughness of the color conversion structure 100 is guided to be located in a lower portion of the groove 410.

Figure 12:
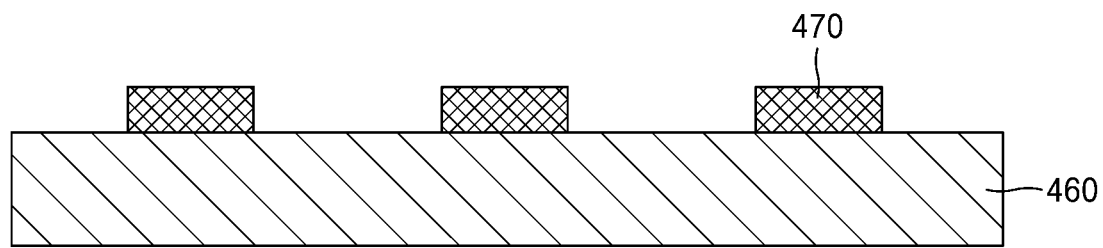
FIGS. 12 through 16 are views for describing a method of manufacturing a display apparatus, according to an example embodiment.

Referring to FIG. 12, a micro semiconductor chip 470 may be arranged on a display substrate 460. The display substrate 460 may be a backplane substrate of a display apparatus, including a driving unit for driving the micro semiconductor chip 470 or a transfer mold substrate for transferring the micro semiconductor chip 470. The micro semiconductor chip 470 may be arranged on the display substrate 460 by using a transfer method. The transfer method may be a pick and place method or a fluidic self-assembly method. The micro semiconductor chip 470 may have a width of, for example, 200 μm or less. A plurality of micro semiconductor chips 470 may be spaced apart from one another in units of sub-pixels.

Figure 13A:
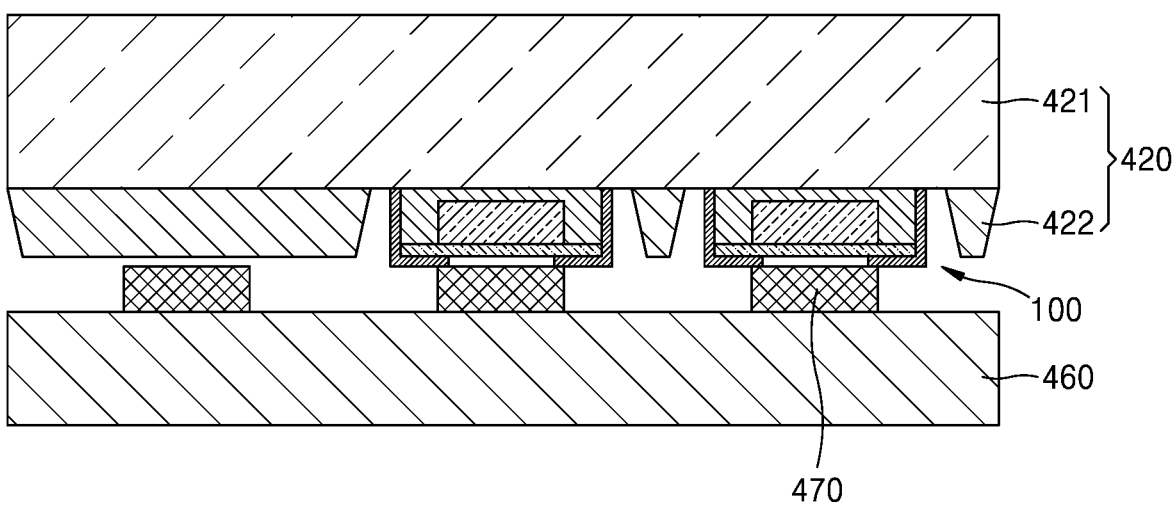
Figure 13B:
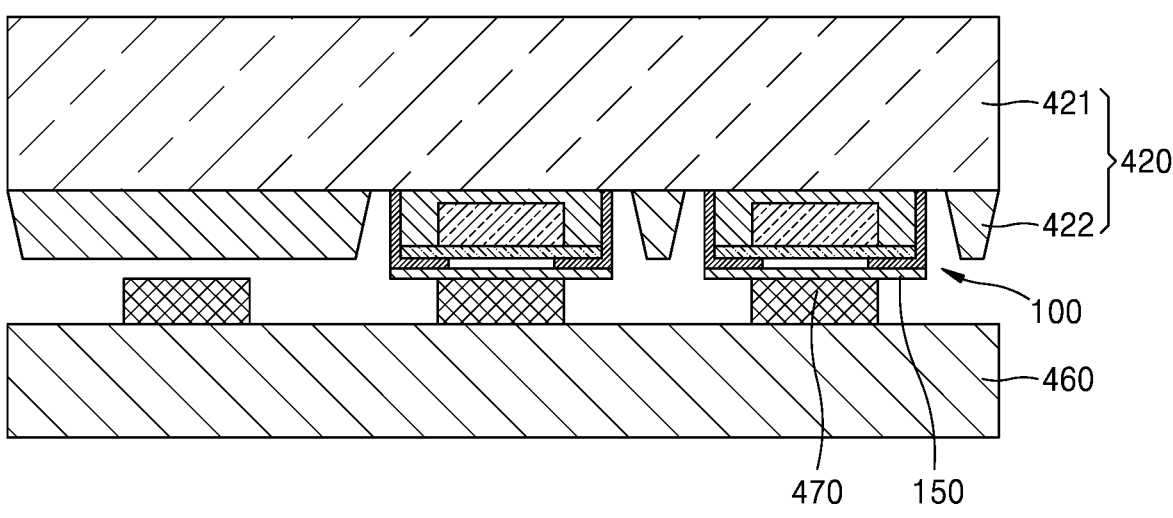
Figure 14:
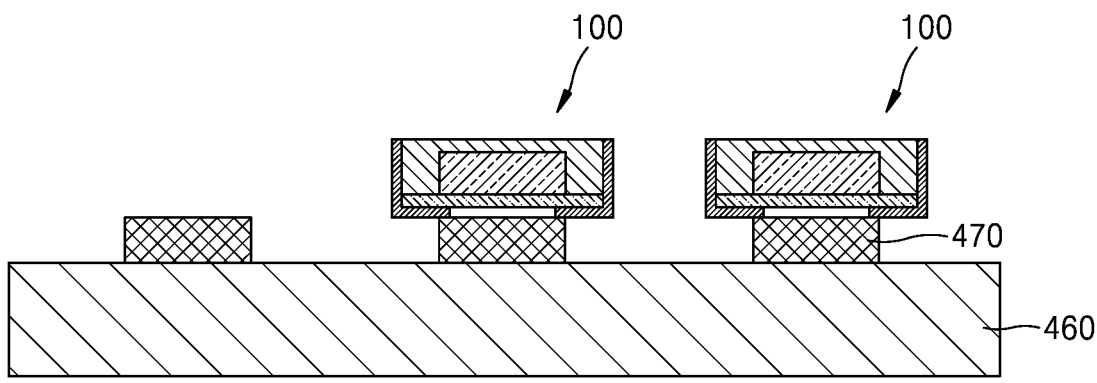

Referring to FIG. 13A, wafer bonding may be performed by causing the micro semiconductor chip 470 to face the color conversion structure 100 transferred to the transfer substrate 420 of FIG. 11. Referring to FIG. 13B, an adhesive layer 150 may be further provided between the color conversion structure 100 and the micro semiconductor chip 470. The adhesive layer 150 may include a transparent material. Referring to FIG. 14, the transfer substrate 420 may be removed. As such, the color conversion structure 100 may be coupled to the micro semiconductor chip 470 in units of wafers.

Figure 15:
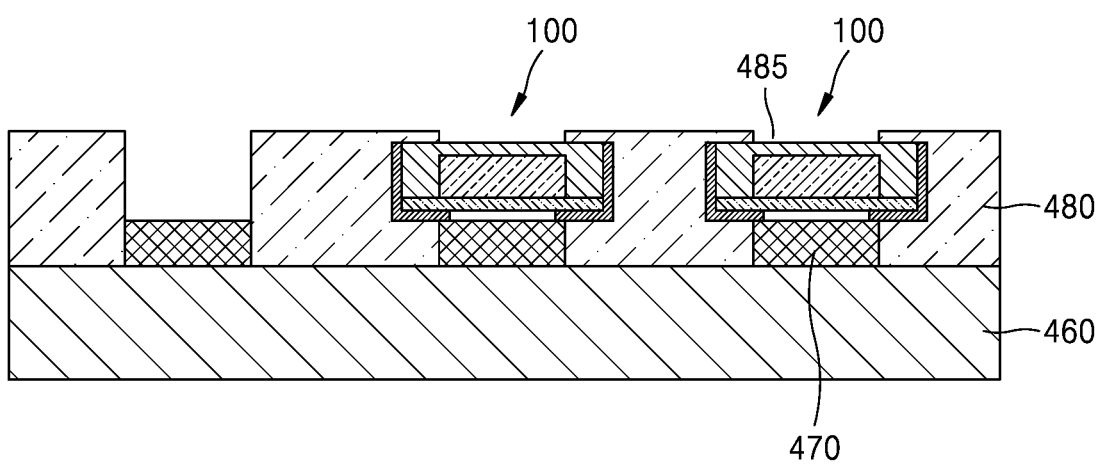

Referring to FIG. 15, a third layer 480 may be provided to cover the color conversion structure 100. The third layer 480 may be an insulating layer. According to an example embodiment, the third layer 480 may be stacked on the display substrate 460 to cover the color conversion structure 100. Also, a window area 485 may be formed by etching the third layer 480 to emit light.

Figure 16:
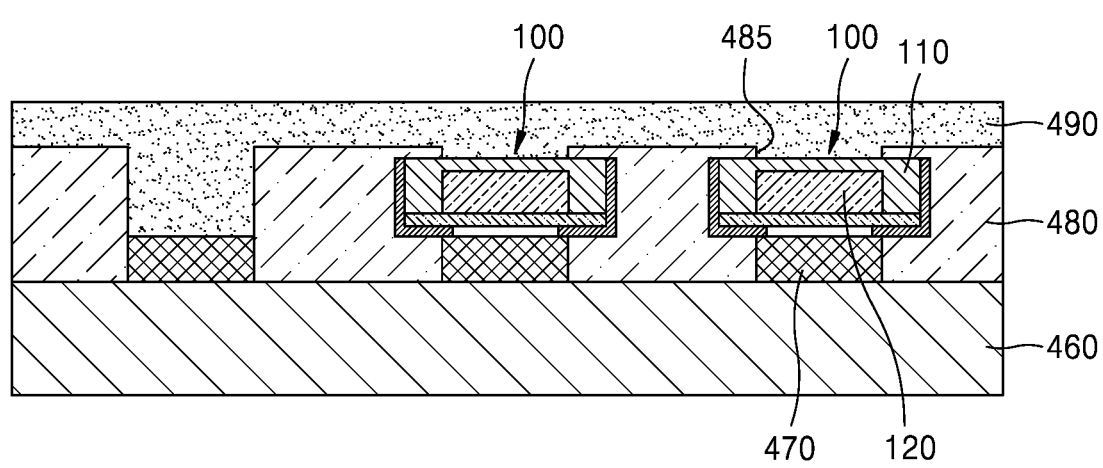

Referring to FIG. 16, a protective layer 490 may be provided on the third layer 480. According to an example embodiment, the protective layer 490 may be stacked on the third layer 480. The protective layer 490 may prevent the color conversion structure 100 from being damaged by an external environment.

According to an example embodiment, when first wavelength light emitted by the micro semiconductor chip 470 is incident on the color conversion structure 100, the first wavelength light may be converted into second wavelength light and may be output from the color conversion structure 100. In order for the first wavelength light to be converted into the second wavelength light, a certain thickness of the color conversion layer 120 of the color conversion structure 100 should be secured. For example, the color conversion layer 120 may have a thickness ranging from about 10 μm to about 15 μm. The color conversion layer 120 may maintain a desired thickness due to the back structure 110.

Figure 17:
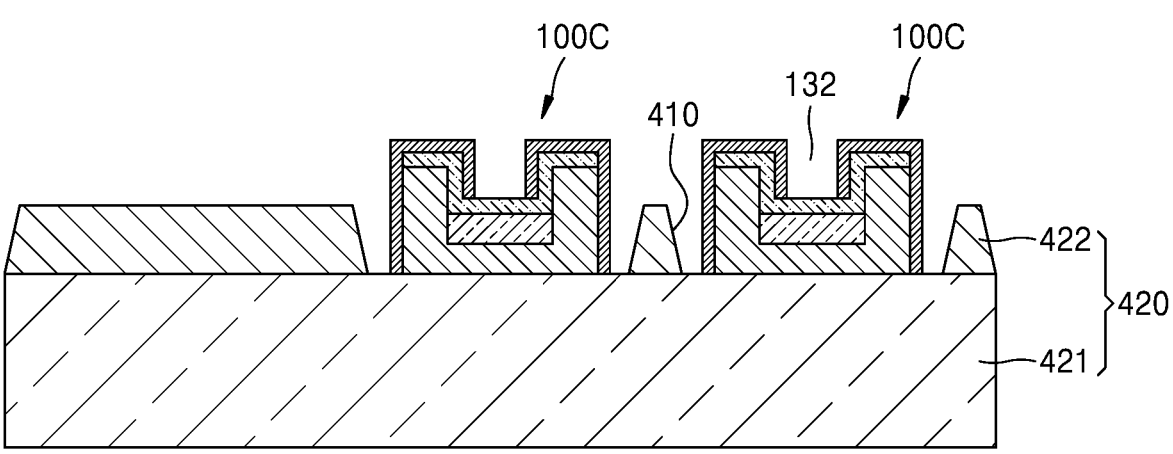
FIGS. 17 through 20 are views for describing a method of manufacturing a display apparatus, according to another example embodiment.

FIG. 17 is a view illustrating a state where the color conversion structure 100C of FIG. 4 is transferred to the transfer substrate 420. A method of transferring the color conversion structure 100C to the transfer substrate 420 is the same as that described with reference to FIGS. 10 and 11, and thus, a detailed description thereof will be omitted.

Figure 18:
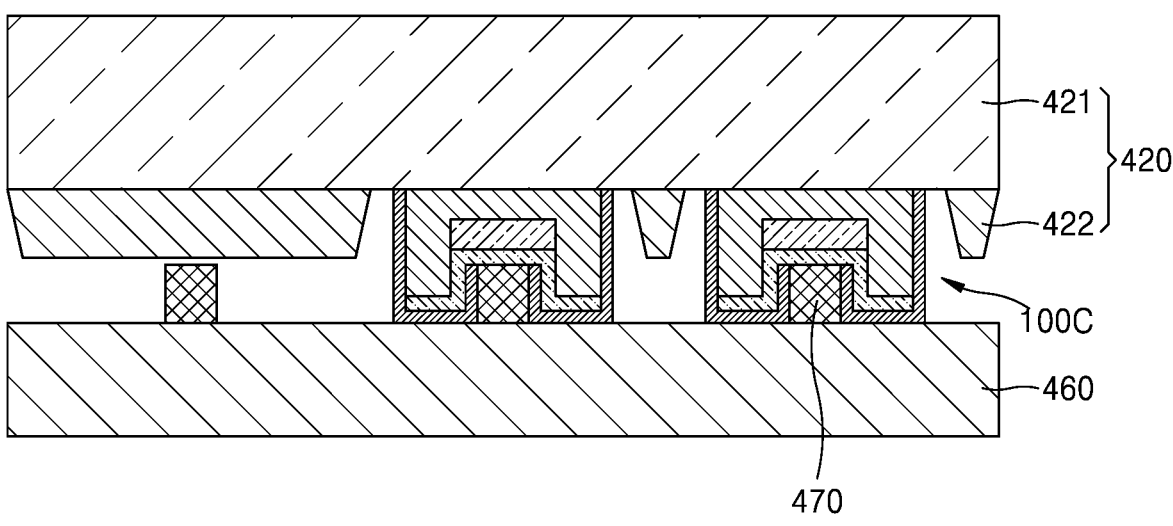

Referring to FIG. 18, the micro semiconductor chip 470 and the color conversion structure 100C may be coupled to each other by causing the color conversion structure 100C to face the micro semiconductor chip 470. The micro semiconductor chip 470 may be inserted into a groove 115 of the color conversion structure 100C. As such, when the micro semiconductor chip 470 is inserted into the groove 115, light emitted from the micro semiconductor chip 470 may be prevented from leaking sideways, thereby improving light efficiency.

Figure 19:
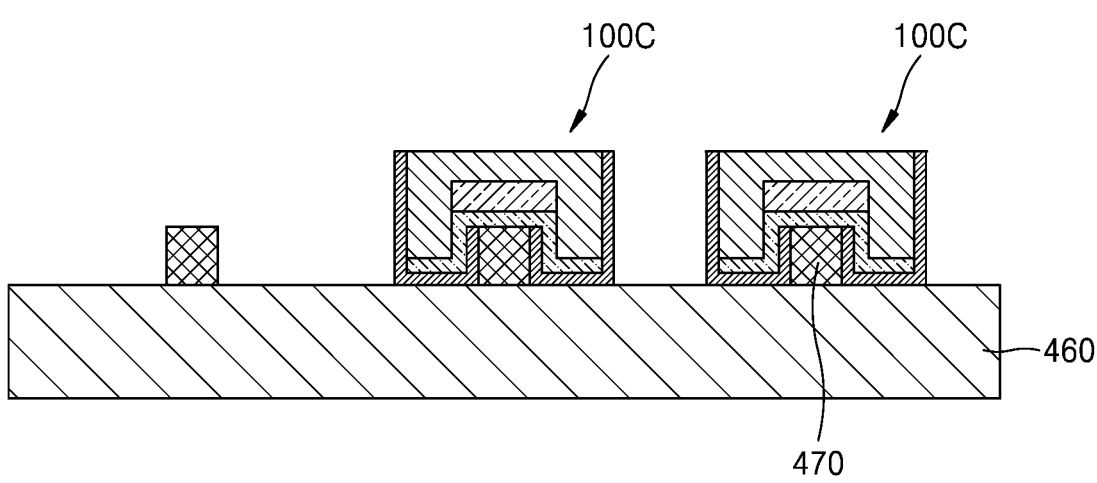
Figure 20:
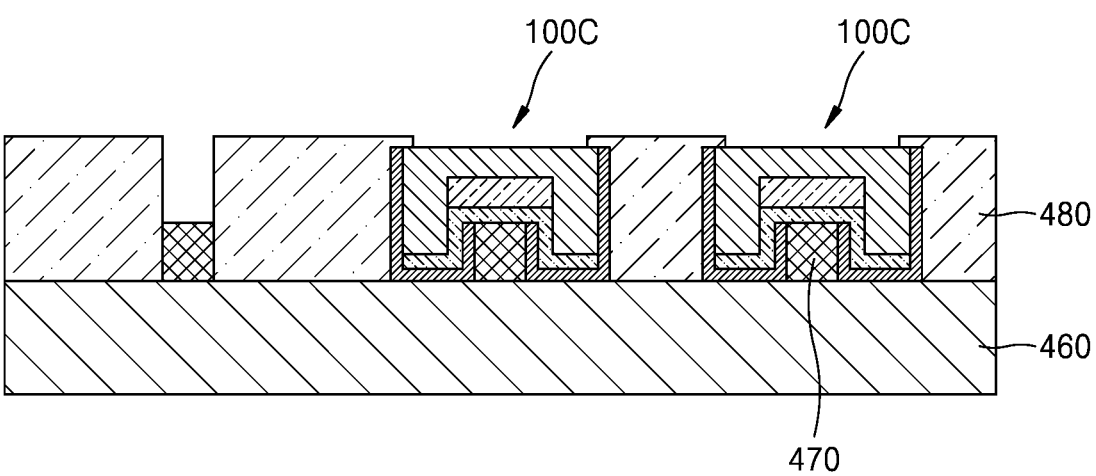

Referring to FIG. 19, the transfer substrate 420 may be removed from the color conversion structure 100C. Referring to FIG. 20, the third layer 480 may be provided between the color conversion structure 100C and the color conversion structure 110C.

As described above, because the color conversion structure according to an example embodiment includes a bank structure in which a color conversion material such as quantum dots may be sufficiently contained, a thickness of a color conversion layer may be easily secured. Because the color conversion structure may be wet transferred to a transfer substrate, productivity may be increased in manufacturing a large-area display apparatus.

Figure 21:
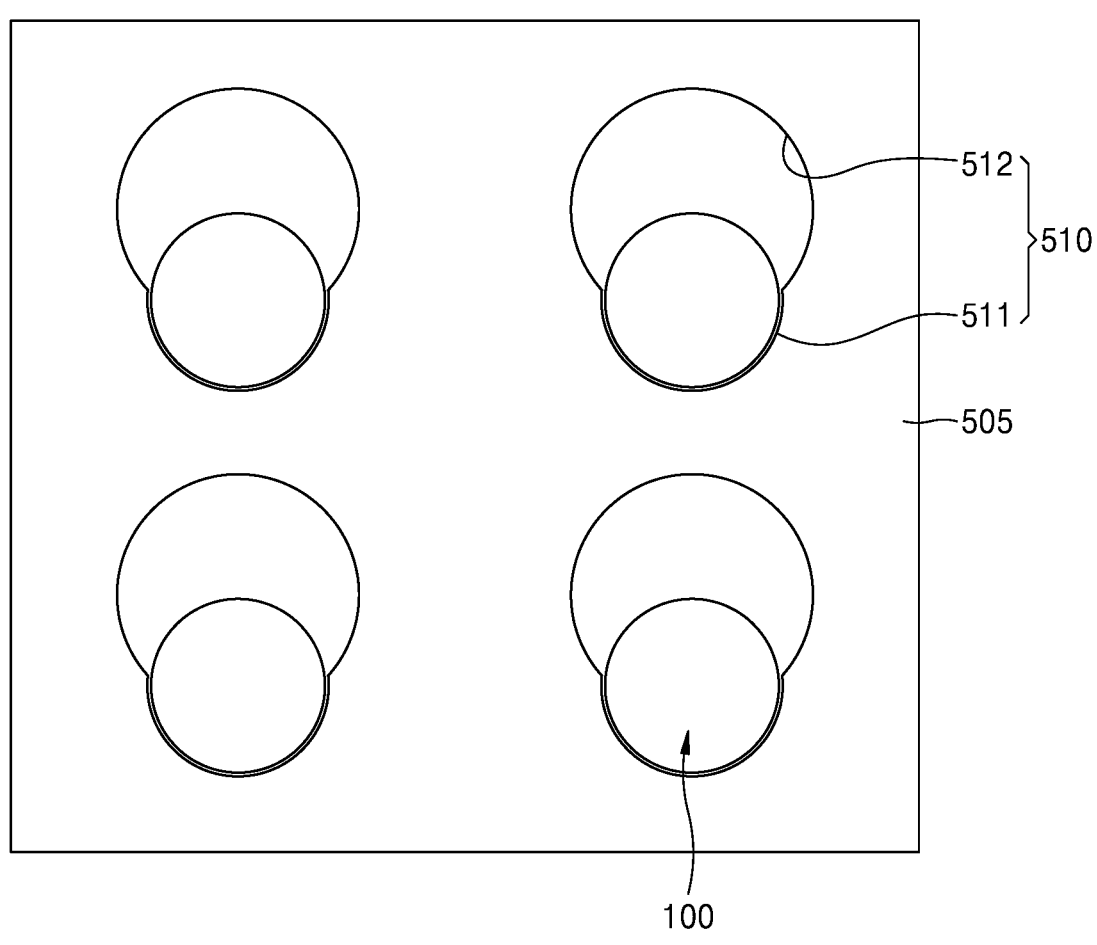
FIG. 21 is a view illustrating a transfer substrate of a color conversion structure, according to an example embodiment.

FIG. 21 is a view illustrating a transfer substrate 505 to which the color conversion structure 100 is transferred, according to another example embodiment. The transfer substrate 505 may include a groove 510 in which the color conversion structure 100 may be accommodated. The groove 510 may include a first groove 511 corresponding to the color conversion structure 100 and a second groove 512 larger than the first groove 511 and connected to the first groove 511. The first groove 511 may be deviated from the center of the groove 510 toward a side. The first groove 511 may have, for example, a circular cross-sectional shape, and the second groove 512 may have a shape overlapping a part of the circular cross-sectional shape of the first groove 511.

Because the second groove 512 is larger than the first groove 511, when the color conversion structure 100 is transferred to the transfer substrate 505, the color conversion structure 100 may be easily inserted into the second groove 512. The color conversion structure 100 may be pushed through a scanning process as described above into the second groove 512, and the color conversion structure 100 may be moved in the second groove 512 in a scanning direction to be seated in the first groove 511.

Figure 22:
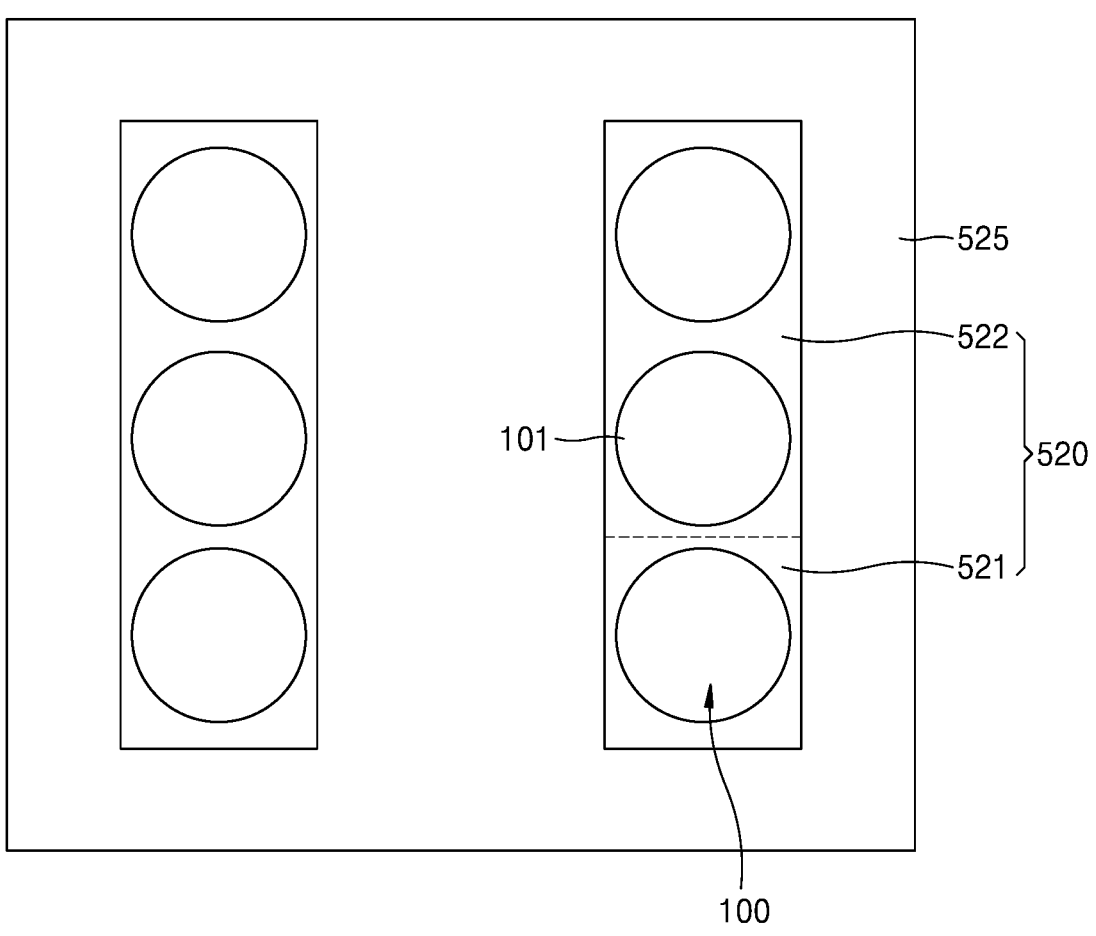
FIG. 22 is a view illustrating a transfer substrate designed to be used multiple times in a color conversion structure, according to an example embodiment.

FIG. 22 is a view illustrating a transfer substrate 525, according to another example embodiment. The transfer substrate 525 is designed to be used multiple times. The transfer substrate 525 may include a plurality of grooves 520, and each of the grooves 520 may include a plurality of color conversion structures 100 and 101. Each groove 520 may include a transfer area 521 for accommodating the color conversion structure 100 to be transferred to a display apparatus and a preliminary area 522 for accommodating the preliminary color conversion structure 101 to be transferred next. The color conversion structure 101 in the transfer area 521 may be transferred to a display substrate, for example, the display substrate 460 of FIG. 14. Next, the preliminary color conversion structure 101 in the preliminary area 522 may be moved to the transfer area 521, and the color conversion structure 100 moved to the transfer area 521 may be transferred to another display substrate. As such, the transfer substrate 525 may be used multiple times.

Figure 23:
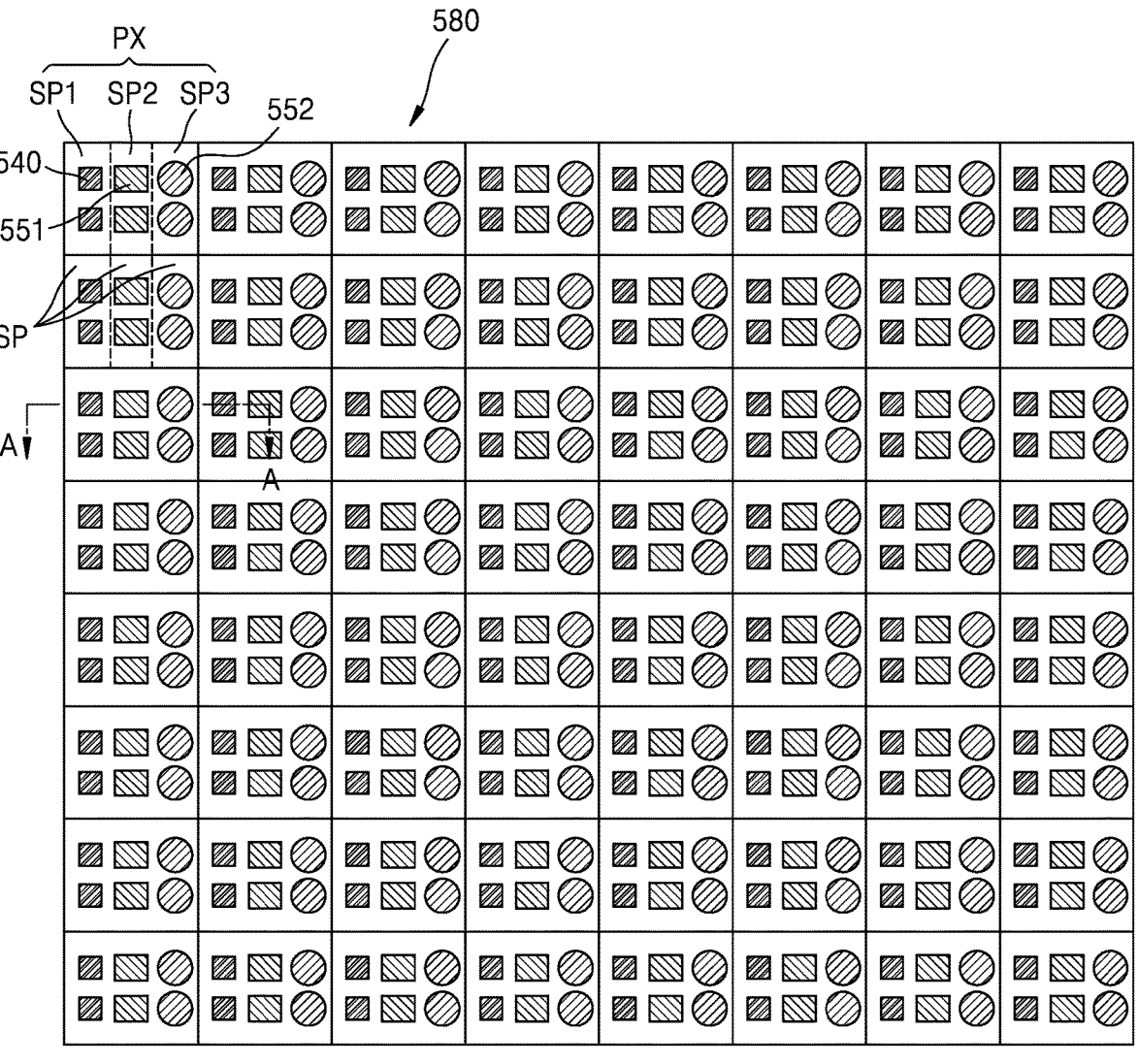
FIG. 23 is a view illustrating a display apparatus, according to an example embodiment.
Figure 24:
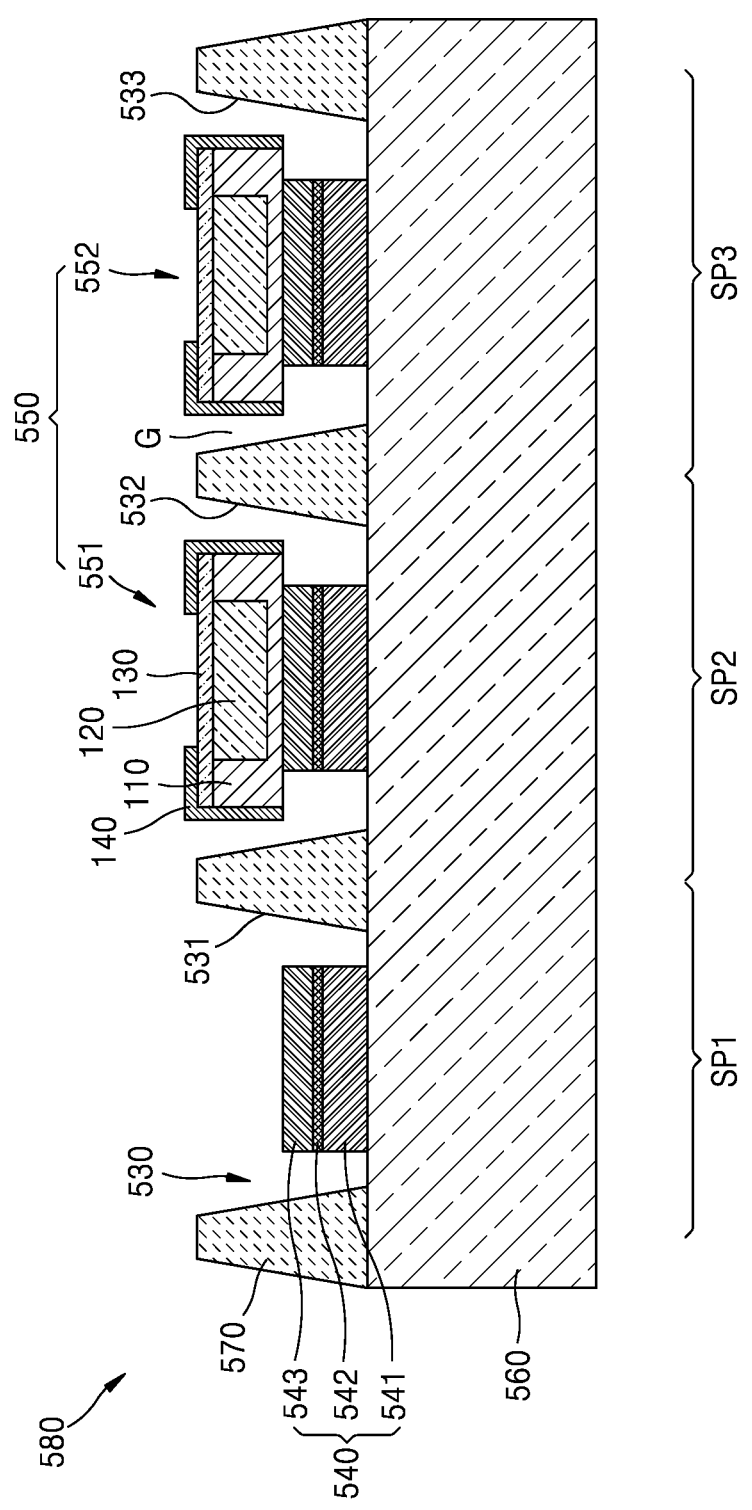
FIG. 24 is a cross-sectional view taken along line A-A of FIG. 23.

FIG. 23 is a view illustrating a display apparatus, according to an example embodiment. FIG. 24 is a cross-sectional view taken along line A-A' of FIG. 23.

Referring to FIG. 23, a display apparatus 580 may include a plurality of pixels PX, and each of the pixels PX may include sub-pixels SP emitting light of different colors. The pixel PX may be one unit for displaying an image. An image may be displayed by controlling the amount of light and a color from each sub-pixel SP. For example, each of the pixels PX may include a first sub-pixel SP1, a second sub-pixel SP2, and a third sub-pixel SP3.

Referring to FIG. 24, the display apparatus 580 may include a substrate 560, a partition wall 570 provided on the substrate 560, a micro semiconductor chip 540 provided in a groove 530 divided by the partition wall 570, and a color conversion structure 550 provided on the micro semiconductor chip 540. The substrate 560 may include a driving circuit for driving the micro semiconductor chip 540.

The groove 530 may include, for example, a first groove 531, a second groove 532, and a third groove 533. The micro semiconductor chip 540 may be provided in each of the first groove 531, the second groove 532, and the third groove 533. The micro semiconductor chip 540 may be a micro light-emitting device that emits, for example, blue light. The micro semiconductor chip 540 may include a first semiconductor layer 541, an emission layer 542, and a second semiconductor layer 543 which are sequentially stacked. The first semiconductor layer 541 may include a first-type semiconductor. For example, the first semiconductor layer 541 may include an n-type semiconductor. The first semiconductor layer 541 may include an n-type group III-V semiconductor, for example, n-GaN. The first semiconductor layer 542 may have a single or multi-layer structure.

The emission layer 542 may be provided on a top surface of the first semiconductor layer 541. In the emission layer 542, electrons and holes are combined to generate light. The emission layer 542 may have a multi-quantum well (MQW) structure or a single-quantum well (SQW) structure. The emission layer 542 may include a group III-V semiconductor, for example, GaN.

The second semiconductor layer 543 may be provided on a top surface of the emission layer 542. The second semiconductor layer 543 may include, for example, a p-type semiconductor. The second semiconductor layer 543 may include, a p-type group III-V semiconductor, for example, p-GaN. The second semiconductor layer 543 may have a single or multi-layer structure. Alternatively, when the first semiconductor layer 541 includes a p-type semiconductor, the second semiconductor layer 543 may include an n-type semiconductor.

The micro semiconductor chip 540 may be transferred to the substrate 560. The micro semiconductor chip 540 may be transferred by using a stamp method, a pick and place method, or a fluidic self-assembly method. When the micro semiconductor chip 540 is etched or cut into a transferable shape, the first semiconductor layer 541, the emission layer 542, and the second semiconductor layer 543 may have the same width.

The color conversion structure 550 may be substantially the same as that described with reference to FIG. 1. Although the color conversion structure 450 in FIG. 24 has the same structure as that described with reference to FIG. 1, the color conversion structures described with reference to FIGS. 2 through 7 may be applied.

The color conversion structure 550 may include a first color conversion structure 551 provided in the second sub-pixel SP2 and a second color conversion structure 552 provided in the third sub-pixel SP3. For convenience of explanation, reference numerals of elements of the color conversion structure 550 are the same as in FIG. 1. The color conversion structure 550 may not be provided in the first sub-pixel SP1. The color conversion layer 120 of the first color conversion structure 551 may be excited by blue light emitted by the micro semiconductor chip 540 to emit red light. The color conversion layer 120 of the second color conversion structure 552 may be excited by blue light emitted by the micro semiconductor chip 540 to emit green light. An emitted wavelength may vary according to a material or a size of quantum dots in the color conversion layer 120 of the color conversion structure 550.

In order to increase the area of a portion of the color conversion structure 550 for receiving light emitted from the micro semiconductor chip 540, a width of the color conversion structure 550 may be greater than a width of the micro semiconductor chip 540. In the present example embodiment, the color conversion structure 550 may be transferred to the micro semiconductor chip 540 by using a wet transfer method described above. In this case, the micro semiconductor chip 540 and the banking structure 110 may face each other. When the color conversion structure 550 is transferred to the micro semiconductor chip 540, a position of the color conversion structure 550 in the groove 230 may be irregular. Hence, a relative position of the color conversion structure 550 with respect to the micro semiconductor chip 540 may be different for each sub-pixel SP. In case that a width of the color conversion structure 550 is greater than a width of the micro semiconductor chip 540, even when a transfer position of the color conversion structure 550 is changed, the area of a portion capable of receiving light emitted from the micro semiconductor chip 540 may be secured as wide as possible.

The color conversion structure 550 may be spaced apart from the partition wall 570. Because the color conversion structure 550 is transferred to and located in the groove 530 but is not filled in the groove 530, there may be a gap G between the color conversion structure 550 and the partition wall 570.

FIG. 24 is a sectional view of FIG. 23. FIG. 23 illustrates one pixel PX, and the pixel PX may include the first sub-pixel SP1, the second sub-pixel SP2, and the third sub-pixel SP3.

A plurality of grooves 530 may be provided by the partition wall 570. The groove 530 may include, for example, the first groove 531 provided in the first sub-pixel SP1, the second groove 532 provided in the second sub-pixel SP2, and the third groove 533 provided in the third sub-pixel SP3. One or more grooves 530 may be provided in each sub-pixel. The plurality of grooves 530 may have a cross-sectional shape or a size that varies according to a sub-pixel. A size may indicate a cross-sectional area or a width of the groove 530. For example, the first groove 531 may have a quadrangular cross-sectional shape, the second groove 532 may have a quadrangular cross-sectional shape larger than that of the first groove 531, and the third groove 533 may have a circular cross-sectional shape. A color conversion structure may have a shape or a size corresponding to a shape or a size of a groove. For example, the first color conversion structure 551 may have a quadrangular cross-sectional shape corresponding to the second groove 532, and the second color conversion structure 552 may have a circular cross-sectional shape corresponding to the third groove 533.

As such, because the groove 530 and the color conversion structure 550 have a cross-sectional shape or a size varying according to a sub-pixel, when the color conversion structure 550 is transferred to the groove 530, the color conversion structure 550 may be transferred to a desired sub-pixel. When the first groove 531 has a smallest size and the second groove 532 and the third groove 533 have different cross-sectional shapes, the first color conversion structure 551 and the second color conversion structure 552 may be simultaneously transferred. In more detail, when the first groove 531 has a size such that the first color conversion structure 551 and the second color conversion structure 552 may not be inserted into the first groove 531, a cross-sectional shape thereof is not limited. The second groove 532 may have a size or a cross-sectional shape such that the second color conversion structure 552 is not inserted into the second groove 532, and the third groove 533 may have a size or a cross-sectional shape such that the first color conversion structure 551 is not inserted into the third groove 533.

Alternatively, the grooves may have the same shape and may have different sizes. For example, the first groove 531, the second groove 532, and the third groove 533 may have quadrangular cross-sectional shapes, and there may be a relationship of width (or size) of the first groove 531<width (or size) of the second groove 532<width (or size) of the third groove 533, and there may be a relationship of width (or size) of the first color conversion structure 551<width (or size) of the second color conversion structure 552. In this case, the first color conversion structure 551 and the second color conversion structure 552 are sequentially transferred. The second color conversion structure 552 having a largest size is first transferred to the third groove 533, and then the first color conversion structure 551 is transferred to the second groove 532.

The first color conversion structure 551 and the second color conversion structure 552 may be simultaneously or sequentially transferred to corresponding grooves, by appropriately selecting shapes and sizes of the first groove 531, the second groove 532, the third groove 533, the first color conversion structure 551, and the second color conversion structure 552.

Figure 25:
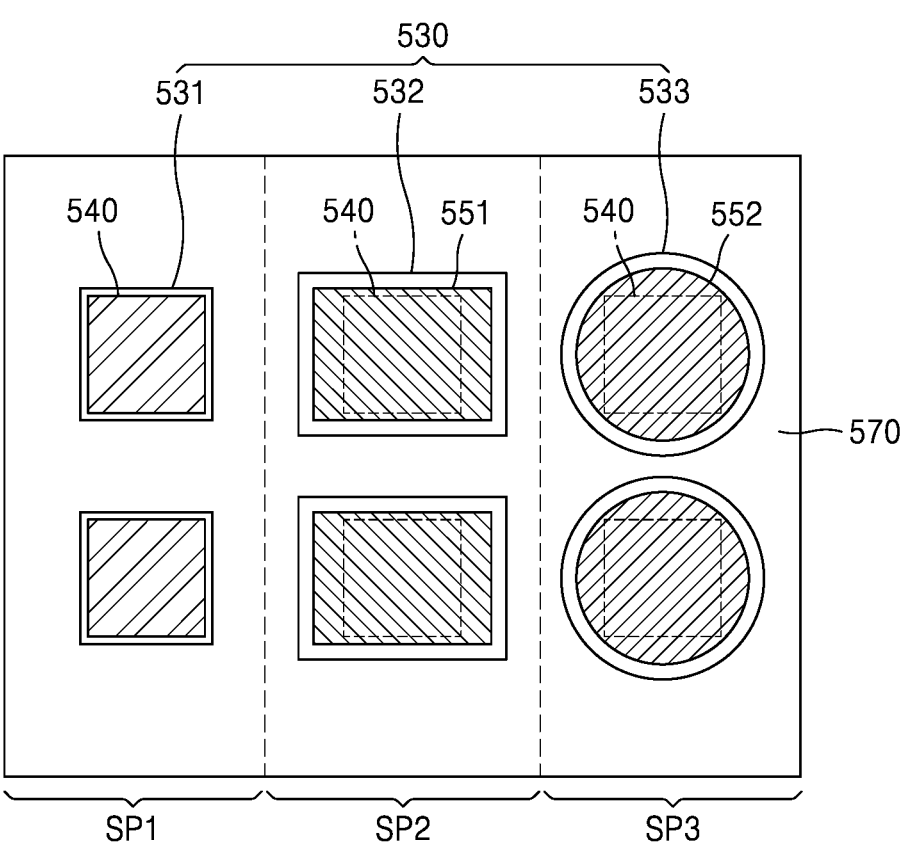
FIG. 25 is a plan view of FIG. 24.

Although there may be a various number of grooves in each sub-pixel, in FIG. 25, two grooves are provided in each sub-pixel.

Figure 26:
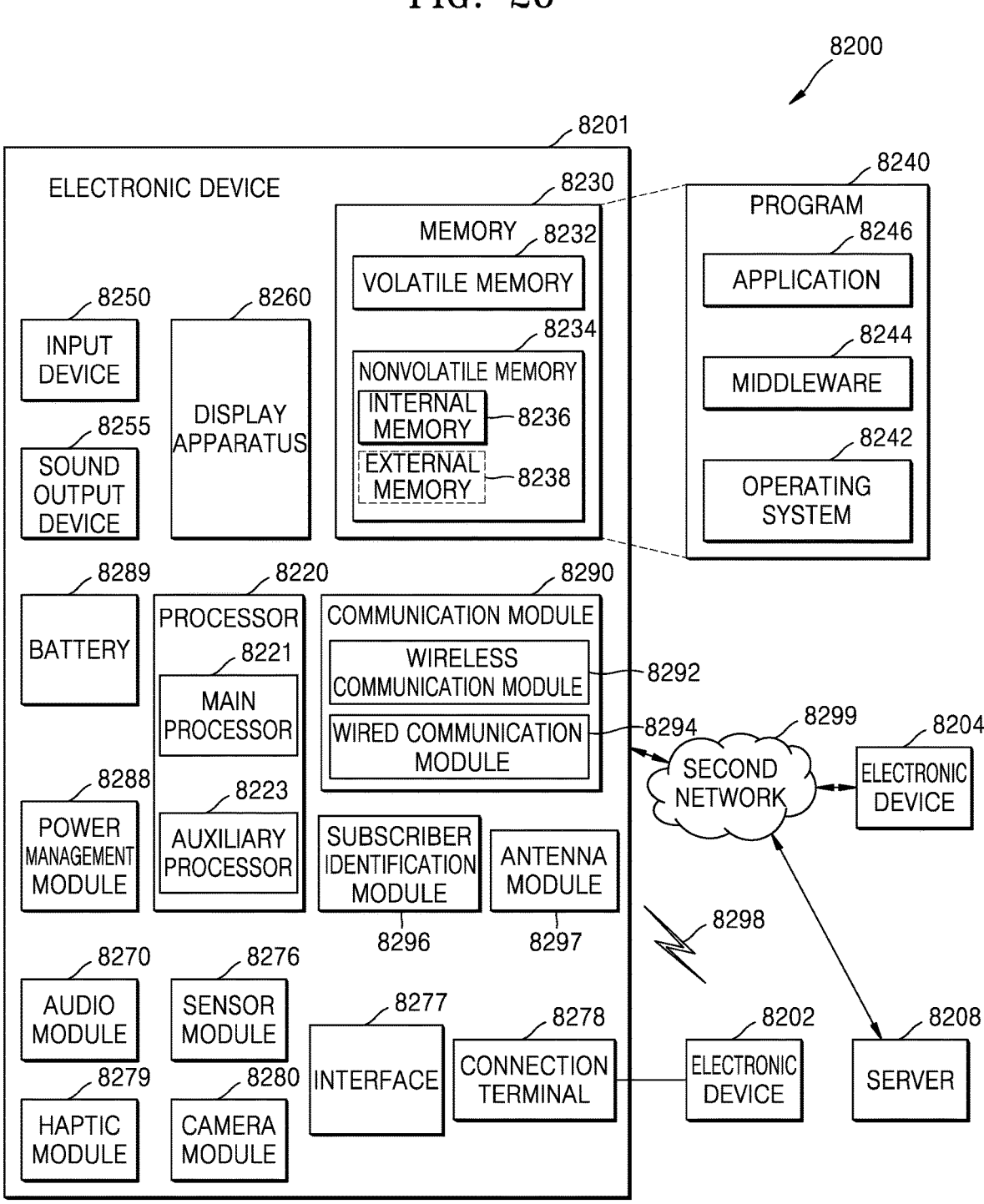
FIG. 26 is a block diagram illustrating an electronic device, according to an example embodiment.

FIG. 26 is a block diagram illustrating an electronic device including a display apparatus, according to an example embodiment.

Referring to FIG. 26, an electronic device 8201 may be provided in a network environment 8200. In the network environment 8200, the electronic device 8201 may communicate with another electronic device 8202 through a first network 8298 (e.g., a short-range wireless communication network), or may communicate with another electronic device 8204 and/or a server 8208 through a second network 8299 (e.g., a long-range wireless communication network). The electronic device 8201 may communicate with the electronic device 8204 through the server 8208. The electronic device 8201 may include a processor 8220, a memory 8230, an input device 8250, a sound output device 8255, a display apparatus 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. Some of the elements may be omitted from the electronic device 8201, or other elements may be added to the electronic device 8201. Some of the elements may be implemented as one integrated circuit. For example, the sensor module 8276 (e.g., a fingerprint sensor, an iris sensor, or an illuminance sensor) may be embedded in the display apparatus 8260 (e.g., a display).

The processor 8220 may execute software (e.g., a program 8240) to control one or more other elements (e.g., hardware or software elements) in the electronic device 8201 connected to the processor 8220, and may perform various data processing or operations. As part of the data processing or operations, the processor 8220 may load commands and/or data received from other elements (e.g., the sensor module 8276 and the communication module 8290) into a volatile memory 8232, may process the commands and/or data stored in the volatile memory 8232, and may store resulting data in a nonvolatile memory 8234. The nonvolatile memory 8234 may include an internal memory 8236 and an external memory 8238. The processor 8220 may include a main processor 8221 (e.g., a central processing unit or an application processor) and an auxiliary processor 8223 (e.g., a graphics processing unit, an image signal processor, a sensor hub processor, or a communication processor) which may operate independently or together with the main processor 8221. The auxiliary processor 8223 may use less power than the main processor 8221 and may perform a specialized function.

The auxiliary processor 8223 may operate on behalf of the main processor 8221 while the main processor 8221 is in an inactive state (e.g., a sleep state), or together with the main processor 8221 while the main processor 8221 is in an active state (e.g., an application execution state), to control functions and/or states related to some (e.g., the display apparatus 8260, the sensor module 8276, and the communication module 8290) of the elements of the electronic device 8201. The auxiliary processor 8223 (e.g., an image signal processor or a communication processor) may be implemented as a part of other functionally related elements (e.g., the camera module 8280 and the communication module 8290).

The memory 8230 may store a variety of data required by elements (e.g., the processor 8220 and the sensor module 8276) of the electronic device 8201. The data may include, for example, input data and/or output data for software (e.g., the program 8240) and related commands. The memory 8230 may include the volatile memory 8232 and/or the nonvolatile memory 8234.

The program 8240 may be stored as software in the memory 8230, and may include an operating system 8242, middleware 8244, and/or an application 8246.

The input device 8250 may receive commands and/or data to be used by an element (e.g., the processor 8220) of the electronic device 8201 from the outside (e.g., a user) of the electronic device 8201. The input device 8250 may include a remote controller, a microphone, a mouse, a keyboard, and/or a digital pen (e.g., a stylus pen).

The sound output device 8255 may output a sound signal to the outside of the electronic device 8201. The sound output device 8255 may include a speaker and/or a receiver. The speaker may be used for general purposes such as multimedia playback or recording playback, and the receiver may be used to receive an incoming call. The receiver may be coupled as a part of the speaker, or may be implemented as an independent separate device.

The display apparatus 8260 may visually provide information to the outside of the electronic device 8201. The display apparatus 8260 may include a display, a hologram device, or a projector, and a control circuit for controlling a corresponding device. The display apparatus 8260 may include the display apparatus described with reference to FIGS. 1 through 25. The display apparatus 8260 may include touch circuitry configured to sense a touch, and/or a sensor circuit (e.g., a pressure sensor) configured to measure an intensity of a force generated by the touch.

The audio module 8270 may convert sound into an electrical signal, or may convert an electrical signal into sound. The audio module 8270 may obtain sound through the input device 8250, or may output sound through the sound output device 8255 and/or a speaker and/or a headphone of another electronic device (e.g., the electronic device 8202) connected directly or wirelessly to the electronic device 8201.

The sensor module 8276 may detect an operating state (e.g., power or a temperature) of the electronic device 8201 or an external environment state (e.g., a user state), and may generate an electrical signal and/or a data value corresponding to the detected state. The sensor module 8276 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more designated protocols that may be used to directly or wirelessly connect the electronic device 8201 to another electronic device (e.g., the electronic device 8202). The interface 8277 may include a high-definition multimedia interface (HDMI), a universal serial bus (USB) interface, a secure digital (SD) card interface, and/or an audio interface.

A connection terminal 8278 may include a connector through which the electronic device 8201 may be physically connected to another electronic device (e.g., the electronic device 8202). The connection terminal 8278 may include an HDMI connector, a USB connector, an SD card connector, and/or an audio connector (e.g., a headphone connector).

The haptic module 8279 may convert an electrical signal into a mechanical stimulus (e.g., a vibration or a motion) or an electrical stimulus that may be perceived by a user through tactile or kinesthetic sense. The haptic module 8279 may include a motor, a piezoelectric element, and/or an electrical stimulation device.

The camera module 8280 may capture a still image and a moving image. The camera module 8280 may include a lens assembly including one or more lenses, image sensors, image signal processors, and/or flashes. The lens assembly included in the camera module 8280 may collect light emitted from a subject whose image is captured.

The power management module 8288 may manage power supplied to the electronic device 8201. The power management module 8288 may be implemented as a part of a power management integrated circuit (PMIC).

The battery 8289 may supply power to elements of the electronic device 8201. The battery 8289 may include a non-rechargeable primary cell, a rechargeable secondary cell, and/or a fuel cell.

The communication module 8290 may support establishment of a direct (wired) communication channel and/or a wireless communication channel between the electronic device 8201 and another electronic device (e.g., the electronic device 8202, the electronic device 8204, or the server 8208), and communication through the established communication channel. The communication module 8290 may include one or more communication processors that operate independently of the processor 8220 (e.g., an application processor) and support direct communication and/or wireless communication. The communication module 8290 may include a wireless communication module 8292 (e.g., a cellular communication module, a short-range wireless communication module, or a global navigation satellite system (GNSS) communication module) and/or a wired communication module 8294 (e.g., a local area network (LAN) communication module or a power line communication module). A corresponding communication module from among the communication modules may communicate with another electronic device through the first network 8298 (e.g., a short-range communication network such as Bluetooth, WiFi Direct, or infrared data association (IrDA)) or the second network 8299 (e.g., a long-range communication network such as a cellular network, the Internet, or a computer network (e.g., a LAN or a wide area network (WAN)). The various types of communication modules may be integrated into one element (e.g., a single chip), or may be implemented as a plurality of separate elements (e.g., a plurality of chips). The wireless communication module 8292 may identify and authenticate the electronic device 8201 within a communication network such as the first network 8298 and/or the second network 8299 by using subscriber information (e.g., international mobile subscriber identity (IMSI)) stored in the substrate identification module 8296.

The antenna module 8297 may transmit a signal and/or power to the outside (e.g., another electronic device) or may receive a signal and/or power from the outside. An antenna may include a radiator including a conductive pattern formed on a substrate (e.g., a printed circuit board (PCB)). The antenna module 8297 may include one or more antennas. When the antenna module 8297 includes a plurality of antennas, an antenna suitable for a communication method used in a communication network such as the first network 8298 and/or the second network 8299 may be selected from among the plurality of antennas by the communication module 8290. A signal and/or power may be transmitted or received between the communication module 8290 and another electronic device through the selected antenna. Another component (e.g., a radio-frequency integrated circuit (RFIC)) other than the antenna may be included as a part of the antenna module 8297.

Some of the elements may be connected to one another through a communication method (e.g., a bus, a general-purpose input and output (GPIO), a serial peripheral interface (SPI), or a mobile industry processor interface (MIPI)) between peripheral devices, and may exchange signals (e.g., commands or data).

Command or data may be transmitted or received between the electronic device 8201 and the external electronic device 8204 through the server 8208 connected to the second network 8299. The electronic devices 8202 and 8204 may be the same or different type of devices as or from the electronic device 8201. All or some of operations executed by the electronic device 8201 may be performed by at least one of the other electronic devices 8202, 8204, and 8208. For example, when the electronic device 8201 should perform certain functions or services, the electronic device 8201 may transmit a request to one or more other electronic devices to perform some or all of the functions or services, instead of directly performing the functions or services. The other electronic devices receiving the request may execute additional functions or services related to the request, and may transmit a result of the execution to the electronic device 8201. To this end, cloud computing, distributed computing, and/or client-server computing may be used.

Figure 27:
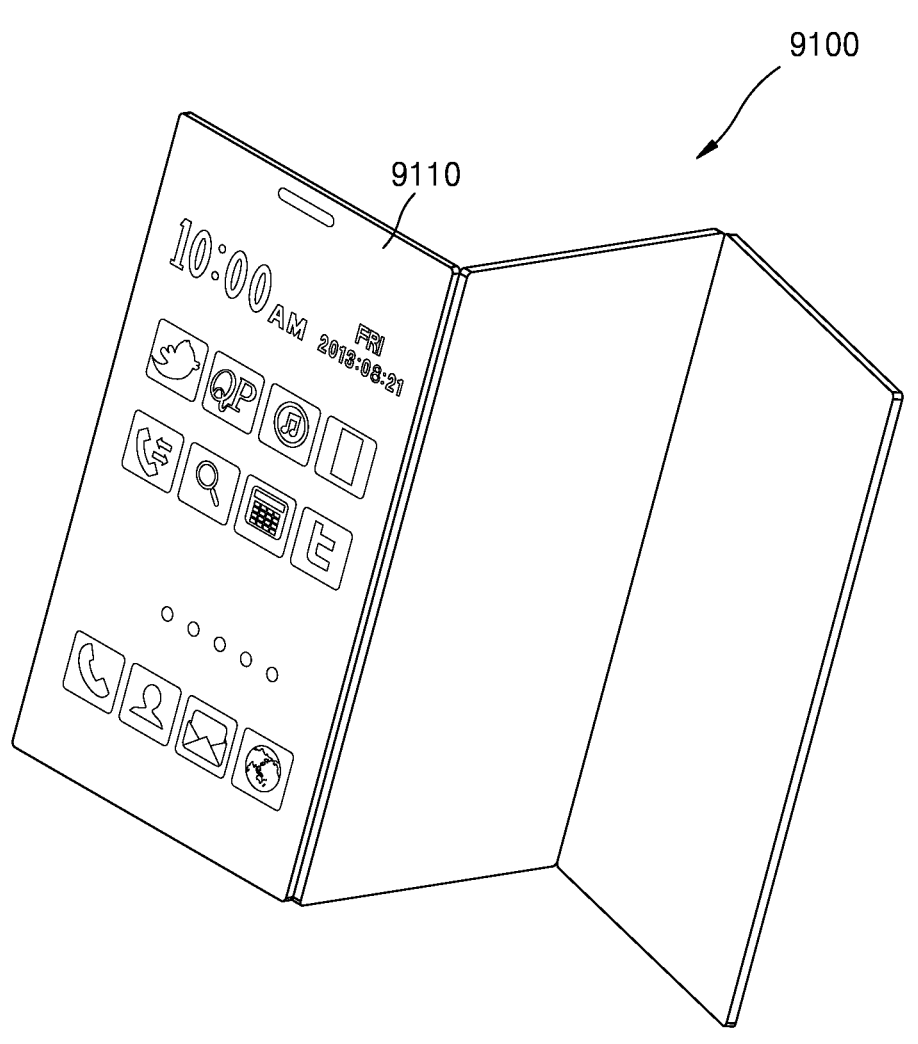
FIG. 27 is a view illustrating an example where a display apparatus is applied to a mobile device, according to an example embodiment.

FIG. 27 is a view illustrating an example where an electronic device is applied to a mobile device, according to an example embodiment. A mobile device 9100 may include a display apparatus 9110, and the display apparatus 9110 may include the display apparatuses described with reference to FIGS. 1 through 25. The display apparatus 9110 may have a foldable structure, for example, a multi-foldable structure.

Figure 28:
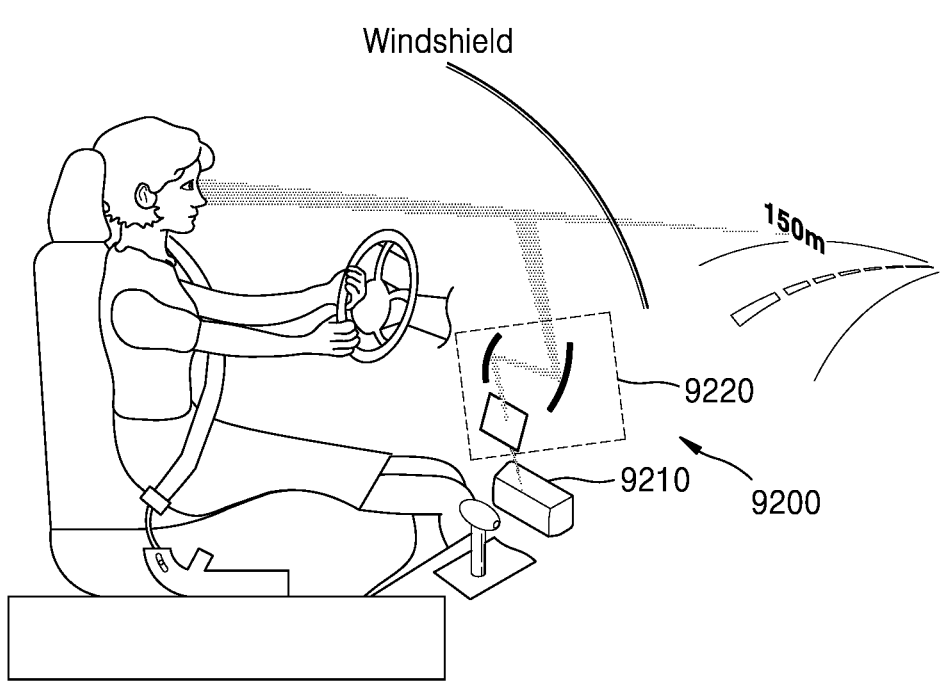
FIG. 28 is a view illustrating an example where a display apparatus is applied to a display apparatus for a vehicle, according to an example embodiment.

FIG. 28 is a view illustrating an example where a display apparatus is applied to a vehicle, according to an example embodiment. A display apparatus may be a head-up display apparatus 9200 for a vehicle, and may include a display 9210 provided in an area of the vehicle, and an optical path changing member 9220 configured to change a path of light so that a driver may see an image generated by the display 9210.

Figure 29:
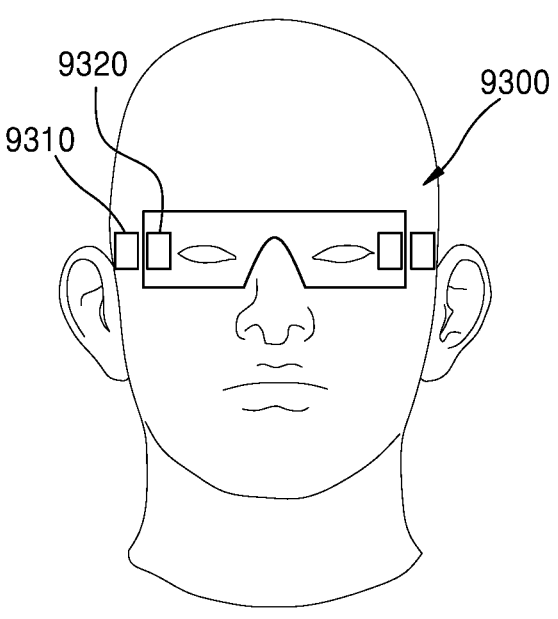
FIG. 29 is a view illustrating an example where a display apparatus is applied to augmented reality glasses, according to an example embodiment.

FIG. 29 is a view illustrating an example where a display apparatus is applied to augmented reality glasses or virtual reality glasses, according to an example embodiment. Augmented reality glasses 9300 may include a projection system 9310 that forms an image, and an element 9320 that guides an image from the projection system 9310 into a user's eyes. The projection system 9310 may include the display apparatus described with reference to FIGS. 1 through 25.

Figure 30:
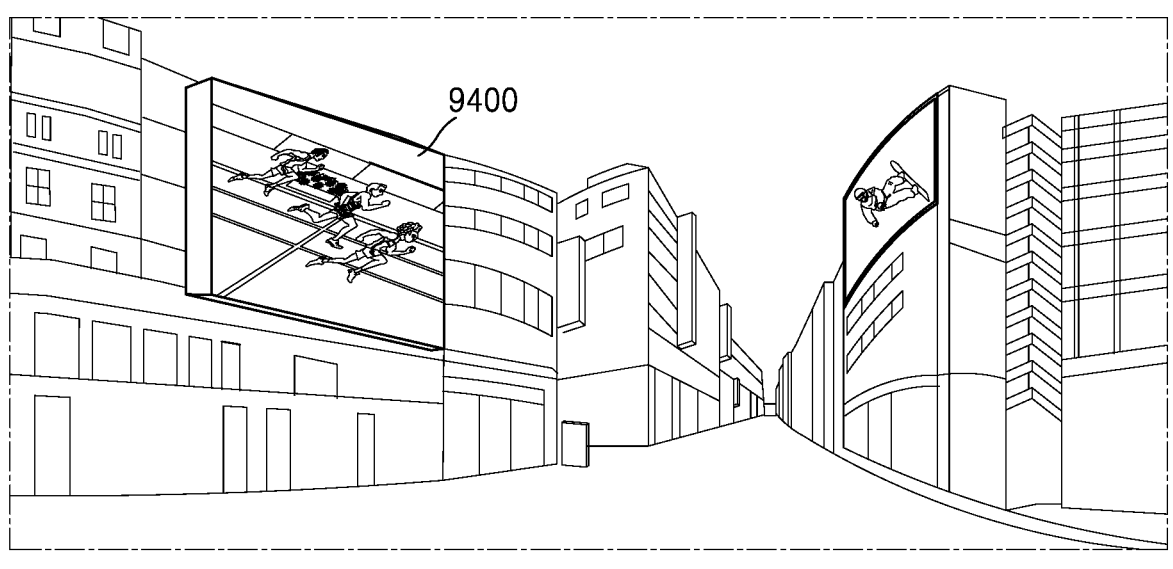
FIG. 30 is a view illustrating an example where a display apparatus is applied to a signage, according to an example embodiment.

FIG. 30 is a view illustrating an example where a display apparatus is applied to a large signage, according to an example embodiment. A signage 9400 may be used for outdoor advertisement using a digital information display, and may control advertisement content or the like through a communication network. The signage 9400 may be implemented through, for example, the electronic device described with reference to FIG. 26.

Figure 31:
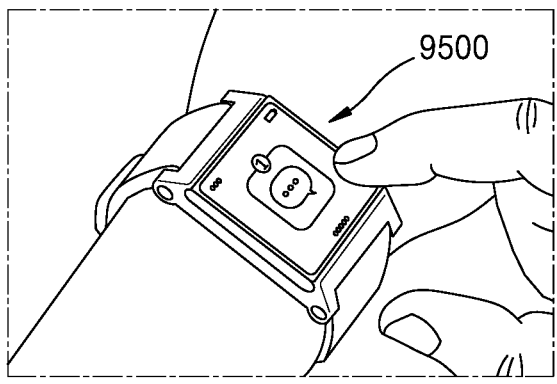
FIG. 31 is a view illustrating an example where a display apparatus is applied to a wearable display, according to an example embodiment.

FIG. 31 is a view illustrating an example where a display apparatus is applied to a wearable display, according to an example embodiment. A wearable display 9500 may include the display apparatus described with reference to FIGS. 1 through 25, and may be implemented through the electronic device described with reference to FIG. 26.

A display apparatus according to an example embodiment may also be applied to various other products such as a rollable TV and a stretchable display.

A color conversion structure according to an example embodiment may be efficiently transferred to a display apparatus using a micro semiconductor chip. The color conversion structure may be transferred by using a fluidic self-assembly method.

A display apparatus according to an example embodiment may efficiently display a color image by using a color conversion structure. A method of manufacturing a color conversion structure according to an example embodiment may easily manufacture a color conversion structure having a film structure.

It should be understood that example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by one of ordinary skill in the art that various changes in form and details may be made therein without departing from the spirit and scope as defined by the following claims.

What is claimed is:

1. A color conversion structure comprising:
a bank structure comprising a groove having a bottom surface and an upper opening;
a color conversion layer provided in the groove and contacting the bottom surface of the groove; and
a cover layer provided on the color conversion layer,
wherein first roughness of the cover layer is greater than second roughness of a bottom surface of the bank structure.

2. The color conversion structure of claim 1, wherein the color conversion layer is formed as a colloidal film.

3. The color conversion structure of claim 1, further comprising a reflective layer provided on a sidewall of the bank structure.

4. The color conversion structure of claim 3, wherein the second roughness of the bottom surface of the bank structure is less than third roughness of the reflective layer.

5. The color conversion structure of claim 1, wherein the cover layer comprises a distributed Bragg reflective layer.

6. The color conversion structure of claim 1, wherein the bank structure comprises a bottom layer and a sidewall, and the bottom layer comprises a distributed Bragg reflective layer.

7. The color conversion structure of claim 1, wherein the groove comprises a curved surface.

8. The color conversion structure of claim 1, wherein the cover layer comprises a convex curved surface.

9. The color conversion structure of claim 1, wherein the color conversion layer comprises a first color conversion layer configured to convert incident light into first color light, and a second color conversion layer configured to convert the incident light into second color light.

10. The color conversion structure of claim 1, wherein an upper surface of the cover layer comprises an uneven structure.

11. The color conversion structure of claim 1, wherein a thickness of the color conversion layer is less than a depth of the groove.

12. The color conversion structure of claim 1, wherein a thickness of the color conversion layer ranges from 10 μm to 15 μm.

13. The color conversion structure of claim 1, wherein the color conversion layer has a structure in which quantum dots are embedded in a porous layer.

14. The color conversion structure of claim 13, wherein the porous layer comprises n-GaN.

15. A display apparatus comprising:
a display substrate;
a plurality of micro semiconductor chips provided on the display substrate to be spaced apart from each other; and
a color conversion structure provided on each of the plurality of micro semiconductor chips,
wherein the color conversion structure comprises:
a bank structure comprising a groove having a bottom surface and an upper opening,
a color conversion layer filled in the groove and contacting the bottom surface of the groove, and
a cover layer provided on the color conversion layer,
wherein first roughness of the cover layer is greater than second roughness of a bottom surface of the bank structure.

16. The display apparatus of claim 15, wherein the second roughness of the bottom surface of the bank structure is less than third roughness of the reflective layer.

17. The display apparatus of claim 15, wherein the cover layer is located adjacent to the respective micro semiconductor chip to face the respective micro semiconductor chip.

18. The display apparatus of claim 15, wherein the color conversion structure further comprises a reflective layer provided on a sidewall of the bank structure.

19. The display apparatus of claim 18, wherein the color conversion layer is formed as a colloidal film.

20. The display apparatus of claim 15, wherein the cover layer is a distributed Bragg reflective layer.

21. The display apparatus of claim 15, wherein the bank structure comprises a bottom layer and a sidewall, and the bottom layer is a distributed Bragg reflective layer.

22. The display apparatus of claim 15, wherein the groove comprises a curved surface.

23. The display apparatus of claim 15, wherein the cover layer comprises a convex curved surface.

24. The display apparatus of claim 15, wherein an upper surface of the cover layer comprises an uneven structure.

25. The display apparatus of claim 15, wherein a thickness of the color conversion layer ranges from 10 μm to 15 μm.

26. The display apparatus of claim 15, wherein the color conversion layer has a structure in which quantum dots are embedded in a porous layer.

27. The display apparatus of claim 26, wherein the porous layer comprises n-GaN.

28. A color conversion structure comprising:
a first layer;
a color conversion layer provided on the first layer;
a first sidewall provided on a first side of the color conversion layer;
a second sidewall provided on a second side of the color conversion layer;
a cover layer provided on the color conversion layer, the first sidewall and the second sidewall,
wherein first roughness of the cover layer is greater than second roughness of a surface of the first layer.

29. The color conversion structure of claim 28, wherein the first layer and the first and second sidewalls are a one-piece structure.

30. The color conversion structure of claim 28, further comprising a reflective layer provided on a sidewall of the bank structure.

31. The color conversion structure of claim 30, wherein the second roughness of the bottom surface of the bank structure is less than third roughness of the reflective layer.

32. The color conversion structure of claim 28, wherein the color conversion layer is formed as a colloidal film.

\* \* \* \* \*